US012663722B2

(12) United States Patent
Saha

(10) Patent No.: US 12,663,722 B2
(45) Date of Patent: Jun. 23, 2026

(54) SYSTEM AND METHOD TO CONTROL DEFECTS IN PROJECTION-BASED SUB-MICROMETER ADDITIVE MANUFACTURING

(71) Applicant: Georgia Tech Research Corporation, Atlanta, GA (US)

(72) Inventor: Sourabh Kumar Saha, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 794 days.

(21) Appl. No.: 17/926,108

(22) PCT Filed: May 20, 2021

(86) PCT No.: PCT/US2021/033362
§ 371 (c)(1),
(2) Date: Nov. 17, 2022

(87) PCT Pub. No.: WO2021/236907
PCT Pub. Date: Nov. 25, 2021

(65) Prior Publication Data
US 2023/0194992 A1 Jun. 22, 2023

Related U.S. Application Data

(60) Provisional application No. 63/027,606, filed on May 20, 2020.

(51) Int. Cl.
*G03F 7/20* (2006.01)
*G03F 7/00* (2006.01)

(52) U.S. Cl.
CPC .............. *G03F 7/2055* (2013.01); *G03F 7/70* (2013.01)

(58) Field of Classification Search
CPC ....... G03F 7/2055; G03F 7/70; B29C 64/135; B29C 64/141; B29C 64/268; B33Y 10/00; B33Y 30/00
USPC ........................................................ 430/326
See application file for complete search history.

(56) References Cited

U.S. PATENT DOCUMENTS

| | | | |
|---|---|---|---|
| 6,658,314 | B1 | 12/2003 | Gothait |
| 11,312,067 | B2 | 4/2022 | Saha et al. |
| 2007/0108644 | A1 | 5/2007 | Cregger |
| 2011/0039213 | A1 | 2/2011 | Fourkas et al. |

FOREIGN PATENT DOCUMENTS

| | | |
|---|---|---|
| WO | 2014/074954 A2 | 5/2014 |
| WO | 2019089007 A1 | 5/2019 |

OTHER PUBLICATIONS

International Search Report and Written Opinion received in PCT/US2021/033362, mailed Sep. 10, 2021, 15 pages.

(Continued)

*Primary Examiner* — Caleen O Sullivan
(74) *Attorney, Agent, or Firm* — Meunier Carlin & Curfman LLC

(57) ABSTRACT
An exemplary optical projection method and system is disclosed, e.g., femtosecond projection two-photon lithography (FP-TPL) based operation, that applies multiple temporally focused light with reduced density of the projected mask to control over-polymerization defects (e.g., without need to tune the photopolymer composition) when certain aspect ratio of the submicron features are desired.

18 Claims, 9 Drawing Sheets

(56) References Cited

OTHER PUBLICATIONS

"Using Lasers with DLP® DMD technology," (Texas Instruments Technical Note, 2008), 9 pages.

Altissimo, E-beam lithography for micro-nanofabrication. Biomicrofluidics 4, 026503 (2010). doi:10.1063/1.3437589.

Bauer, A. Schroer, R. Schwaiger, O. Kraft, Approaching theoretical strength in glassy carbon nanolattices. Nat. Mater. 15, 438-443 (2016). doi:10.1038/nmat4561.

Bauer, L. R. Meza, T. A. Schaedler, R. Schwaiger, X. Zheng, L. Valdevit, Nanolattices: An emerging class of mechanical metamaterials. Adv. Mater. 29, 1701850 (2017). doi:10.1002/adma.201701850.

Fischer, J. B. Mueller, J. Kaschke, T. J. A. Wolf, A.-N. Unterreiner, M. Wegener, Threedimensional multi-photon direct laser writing with variable repetition rate. Opt. Express 21, 26244-26260 (2013). doi:10.1364/OE.21.026244.

Frenzel, M. Kadic, M. Wegener, Three-dimensional mechanical metamaterials with a twist. Science 358, 1072-1074 (2017). doi:10.1126/science.aao4640.

Geng, D. Wang, P. Chen, S.-C. Chen, Ultrafast multi-focus 3-D nano-fabrication based on two-photon polymerization. Nat. Commun. 10, 2179 (2019). doi:10.1038/s41467-019-10249-2.

Gissibl, S. Thiele, A. Herkommer, H. Giessen, Two-photon direct laser writing of ultracompact multi-lens objectives. Nat. Photonics 10, 554-560 (2016). doi:10.1038/nphoton.2016.121.

Gu, D. Zhang, D. Wang, Y. Yam, C. Li, S.-C. Chen, Parallel femtosecond laser light sheet micro-manufacturing based on temporal focusing. Precis. Eng. 50, 198-203 (2017). doi:10.1016/j.precisioneng.2017.05.006.

Hahn V, Kiefer P, Frenzel T, Qu J, Blasco E, Barner-Kowollik C, Wegener M, Rapid Assembly of Small Materials Building Blocks (Voxels) into Large Functional 3D Metamaterials. Advanced Functional Materials 2020: 1907795.

Huang TY, Sakar MS, Mao A, Petruska AJ, Qiu F, Chen XB, Kennedy S, Mooney D, Nelson Bj, 3D printed microtransporters: Compound micromachines for spatiotemporally controlled delivery of therapeutic agents. Advanced Materials 2015; 27(42): 6644-6650.

Huang, M. S. Sakar, A. Mao, A. J. Petruska, F. Qiu, X.-B. Chen, S. Kennedy, D. Mooney, B. J. Nelson, 3D printed microtransporters: Compound micromachines for spatiotemporally controlled delivery of therapeutic agents. Adv. Mater. 27, 6644-6650 (2015). doi:10.1002/adma.201503095.

Jonušauskas, D. Gailevičius, S. Rekštytė, T. Baldacchini, S. Juodkazis, M. Malinauskas, Mesoscale laser 3D printing. Opt. Express 27, 15205-15221 (2019). doi:10.1364/OE.27.015205.

Juodkazis S, Mizeikis V, Seet KK, Misawa H, Wegst UGK, Mechanical properties and tuning of three-dimensional polymeric photonic crystals. Applied Physics Letters 2007; 91(24): 241904.

Juodkazis, V. Mizeikis, K. K. Seet, H. Misawa, U. G. Wegst, Mechanical properties and tuning of three-dimensional polymeric photonic crystals. Appl. Phys. Lett. 91, 241904 (2007). doi:10.1063/1.2822825.

Kelly, I. Bhattacharya, H. Heidari, M. Shusteff, C. M. Spadaccini, H. K. Taylor, Volumetric additive manufacturing via tomographic reconstruction. Science 363, 1075-1079 (2019). doi:10.1126/science.aau7114.

Kim, P. T. So, High-throughput three-dimensional lithographic microfabrication. Opt. Lett. 35, 1602-1604 (2010). doi:10.1364/OL.35.001602.

Li, L.-C. Cheng, C.-Y. Chang, C.-H. Lien, P. J. Campagnola, S.-J. Chen, Fast multiphoton microfabrication of freeform polymer microstructures by spatiotemporal focusing and patterned excitation. Opt. Express 20, 19030-19038 (2012). doi:10.1364/OE.20.019030.

Lu, et al., Novel photoinitiator with a radical quenching moiety for confining radical diffusion in two-photon induced photopolymerization. J. Mater. Chem. 21, 5650-5659 (2011). doi:10.1039/c0jm04025h.

Malinauskas, et al., Mechanisms of three-dimensional structuring of photo-polymers by tightly focussed femtosecond laser pulses. Opt. Express 18, 10209-10221 (2010). doi:10.1364/OE.18.010209.

Maruo, et al., Three-dimensional microfabrication with two-photonabsorbed photopolymerization. Opt. Lett. 22, 132-134 (1997). doi:10.1364/OL.22.000132.

Maruo, H. Inoue, Optically driven micropump produced by three-dimensional two-photon microfabrication. Appl. Phys. Lett. 89, 144101 (2006). doi:10.1063/1.2358820.

Meza, S. Das, J. R. Greer, Strong, lightweight, and recoverable three-dimensional ceramic nanolattices. Science 345, 1322-1326 (2014). doi:10.1126/science.1255908.

Mills B, Grant-Jacob JA, Feinaeugle M, Eason RW, Single-pulse multiphoton polymerization of complex structures using a digital multimirror device. Optics Express 2013; 21(12): 14853-14858.

Mueller, J. Fischer, F. Mayer, M. Kadic, M. Wegener, Polymerization kinetics in threedimensional direct laser writing. Adv. Mater. 26, 6566-6571 (2014). doi:10.1002/adma.201402366.

Oakdale JS, Smith RF, Forien JB, Smith WL, Ali SJ, Bayu Aji LB, Willey TM, Ye J, van Buuren AW, Worthington MA, Direct laser writing of low-density interdigitated foams for plasma drive shaping. Advanced Functional Materials 2017; 27(43): 1702425. doi:10.1002/adfm.201702425.

Oakdale, J. Ye, W. L. Smith, J. Biener, Post-print UV curing method for improving the mechanical properties of prototypes derived from two-photon lithography. Opt. Express 24, 27077-27086 (2016). doi:10.1364/OE.24.027077.

Oron, E. Tal, Y. Silberberg, Scanningless depth-resolved microscopy. Opt. Express 13, 1468-1476 (2005). doi:10.1364/OPEX.13.001468.

Rumi, J. E. Ehrlich, A. A. Heikal, J. W. Perry, S. Barlow, Z. Hu, D. McCord-Maughon, T. C. Parker, H. Röckel, S. Thayumanavan, S. R. Marder, D. Beljonne, J.-L. Brédas, Structure-property relationships for two-photon absorbing chromophores: Bis-donor diphenylpolyene and bis(styryl)benzene derivatives. J. Am. Chem. Soc. 122, 9500-9510 (2000). doi:10.1021/ja994497s.

Saha SK, Nguyen V, Wang D, Oakdale JS, Chen S-C, Parallel two-photon lithography for 3D printing of millimeter scale parts with submicron features, SPIE Photonics West Conference and Exposition 2018; presentation # 10544-23.

Saha SK, Oakdale JS, Cuadra JA, Divin C, Ye J, Forien J-B, Bayu Aji LB, Biener J, Smith WL, Radiopaque resists for two-photon lithography to enable submicron 3D imaging of polymer parts via X-ray computed tomography. ACS Applied Materials & Interfaces 2017; 10(1): 1164-1172.

Saha SK, Uphaus TM, Cuadra JA, Divin C, Ladner IS, Enstrom KG, Panas RM, Kinematic fixtures to enable multi-material printing and rapid non-destructive inspection during two-photon lithography. Precision Engineering 2018; 54: 131-137.

Saha SK, Wang D, Nguyen VH, Chang Y, Oakdale JS, Chen S-C, Scalable submicrometer additive manufacturing, Science 2019; 366: 105-109.

Saha, C. Divin, J. A. Cuadra, R. M. Panas, Effect of proximity of features on the damage threshold during submicron additive manufacturing via two-photon polymerization. J. Micro Nano-Manuf. 5, 031002 (2017). doi:10.1115/1.4036445.

Selimis A, Mironov V, Farsari M, Direct laser writing: Principles and materials for scaffold 3D printing. Microelectronic Engineering 2015; 132: 83-89. doi:10.1016/j.mee.2014.10.001.

Serbin, A. Egbert, A. Ostendorf, B. N. Chichkov, R. Houbertz, G. Domann, J. Schulz, C. Cronauer, L. Fröhlich, M. Popall, Femtosecond laser-induced two-photon polymerization of inorganic-organic hybrid materials for applications in photonics. Opt. Lett. 28, 301-303 (2003). doi:10.1364/OL.28.000301.

Shaw, S. Chizari, M. Shusteff, H. Naghsh-Nilchi, D. Di Carlo, J. B. Hopkins, Scanning two-photon continuous flow lithography for synthesis of high-resolution 3D microparticles. Opt. Express 26, 13543-13548 (2018). doi:10.1364/OE.26.013543.

Shusteff, A. E. M. Browar, B. E. Kelly, J. Henriksson, T. H. Weisgraber, R. M. Panas, N. X. Fang, C. M. Spadaccini, One-step volumetric additive manufacturing of complex polymer structures. Sci. Adv. 3, 05496 (2017). doi:10.1126/sciadv.aao5496.

(56) References Cited

OTHER PUBLICATIONS

Strickland, G. Mourou, Compression of amplified chirped optical pulses. Opt. Commun. 55, 447-449 (1985). doi:10.1016/0030-4018(85)90151-8.

Sun H-B, Kawata S, Two-photon photopolymerization and 3D lithographic microfabrication. Advances in Polymer Science 2004; 170:169-274. doi:10.1007/b94405.

Tanaka T, Sun H-B, Kawata S, Rapid sub-diffraction-limit laser micro/nano-processing in a threshold material system. Applied Physics Letters 2002; 80(2): 312-314.

Vizsnyiczai, L. Kelemen, P. Ormos, Holographic multi-focus 3D two-photon polymerization with real-time calculated holograms. Opt. Express 22, 24217-24223 (2014). doi:10.1364/OE.22.024217.

Von Freymann, A. Ledermann, M. Thiel, I. Staude, S. Essig, K. Busch, M. Wegener, Three dimensional nanostructures for photonics. Adv. Funct. Mater. 20, 1038-1052 (2010). doi:10.1002/adfm. 200901838.

Wang, C. Wen, Y. Chang, W. Lin, S .- C. Chen, Ultrafast laser-enabled 3D metal printing: A solution to fabricate arbitrary submicron metal structures. Precis. Eng. 52, 106-111 (2018). doi:10.1016/j. precisioneng.2017.11.015.

Xia X, Afshar A, Yang H, Portela CM, Kochmann DM, Di Leo CV, Greer JR, Electrochemically reconfigurable architected materials. Nature 2019; 573(7773): 205-213.

Xiong, Y. Liu, L. J. Jiang, Y. S. Zhou, D. W. Li, L. Jiang, J. F. Silvain, Y. F. Lu, Laserdirected assembly of aligned carbon nanotubes in three dimensions for multifunctional device fabrication. Adv. Mater. 28, 2002-2009 (2016). doi:10.1002/adma.201505516.

Yang L, El-Tamer A, Hinze U, Li J, Hu Y, Huang W, Chu J, Chichkov BN, Parallel direct laser writing of micro-optical and photonic structures using spatial light modulator. Optics and Lasers in Engineering 2015; 70: 26-32. doi:10.1016/j.optlaseng.2015.02. 006.

Yang, J. Li, Y. Hu, C. Zhang, Z. Lao, W. Huang, J. Chu, Projection two-photon polymerization using a spatial light modulator. Opt. Commun. 331, 82-86 (2014). doi:10.1016/j.optcom.2014.05.051.

Yew, C. J. Sheppard, P. T. So, Temporally focused wide-field two-photon microscopy: Paraxial to vectorial. Opt. Express 21, 12951-12963 (2013). doi:10.1364/OE.21.012951.

Yih, Y. Y. Hu, Y. D. Sie, L.-C. Cheng, C. H. Lien, S.-J. Chen, Temporal focusing based multiphoton excitation microscopy via digital micromirror device. Opt. Lett. 39, 3134-3137 (2014). doi:10. 1364/OL.39.003134.

Zandrini T, Liaros N, Jiang LJ, Lu YF, Fourkas JT, Osellame R, Baldacchini T, Effect of the resin viscosity on the writing properties of two-photon polymerization. Optical Materials Express 2019; 9(6): 2601-2616.

Zheng, J. Deotte, M. P. Alonso, G. R. Farquar, T. H. Weisgraber, S. Gemberling, H. Lee, N. Fang, C. M. Spadaccini, Design and optimization of a light-emitting diode projection micro-stereolithography three-dimensional manufacturing system. Rev. Sci. Instrum. 83, 125001 (2012). doi:10.1063/1.4769050.

Zhu, J. van Howe, M. Durst, W. Zipfel, C. Xu, Simultaneous spatial and temporal focusing of femtosecond pulses. Opt. Express 13, 2153-2159 (2005). doi:10.1364/OPEX.13.002153.

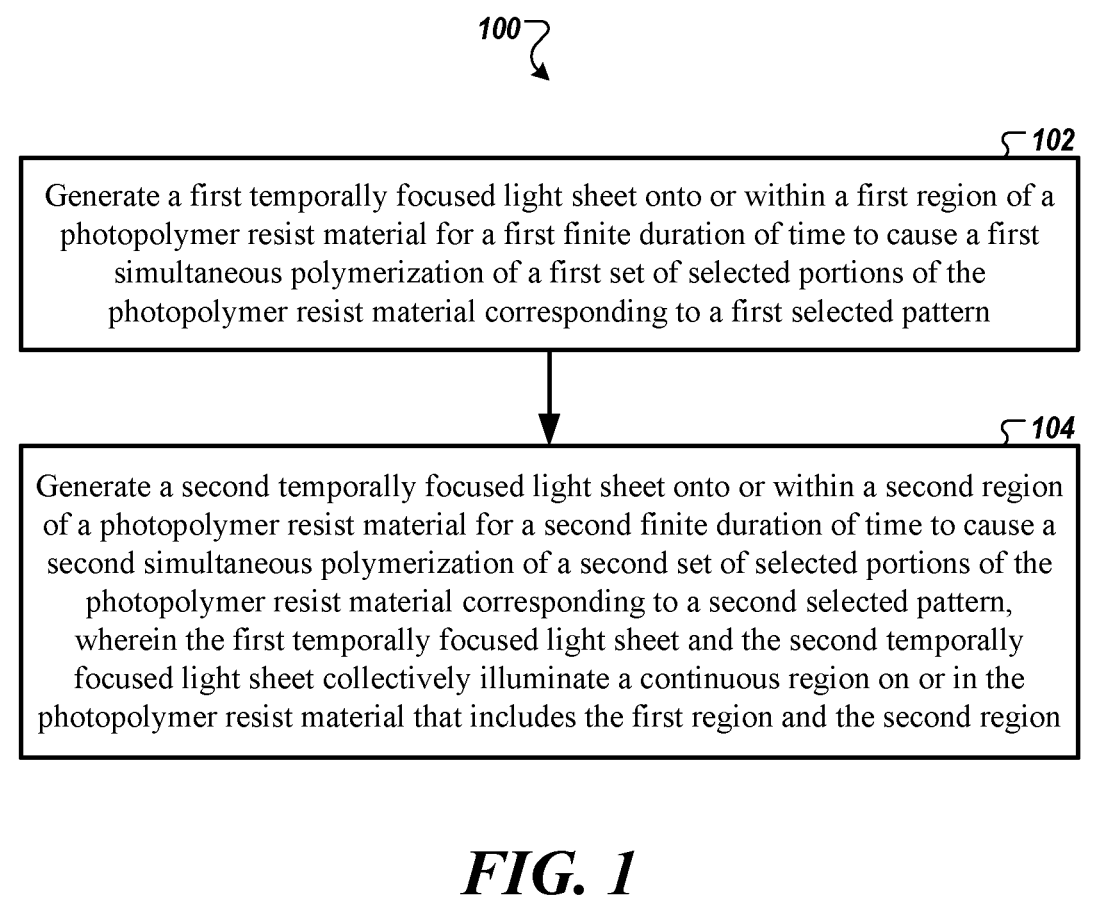

100

*r 102*

Generate a first temporally focused light sheet onto or within a first region of a
photopolymer resist material for a first finite duration of time to cause a first
simultaneous polymerization of a first set of selected portions of the
photopolymer resist material corresponding to a first selected pattern

*r 104*

Generate a second temporally focused light sheet onto or within a second region
of a photopolymer resist material for a second finite duration of time to cause a
second simultaneous polymerization of a second set of selected portions of the
photopolymer resist material corresponding to a second selected pattern,
wherein the first temporally focused light sheet and the second temporally
focused light sheet collectively illuminate a continuous region on or in the
photopolymer resist material that includes the first region and the second region

FIG. 1

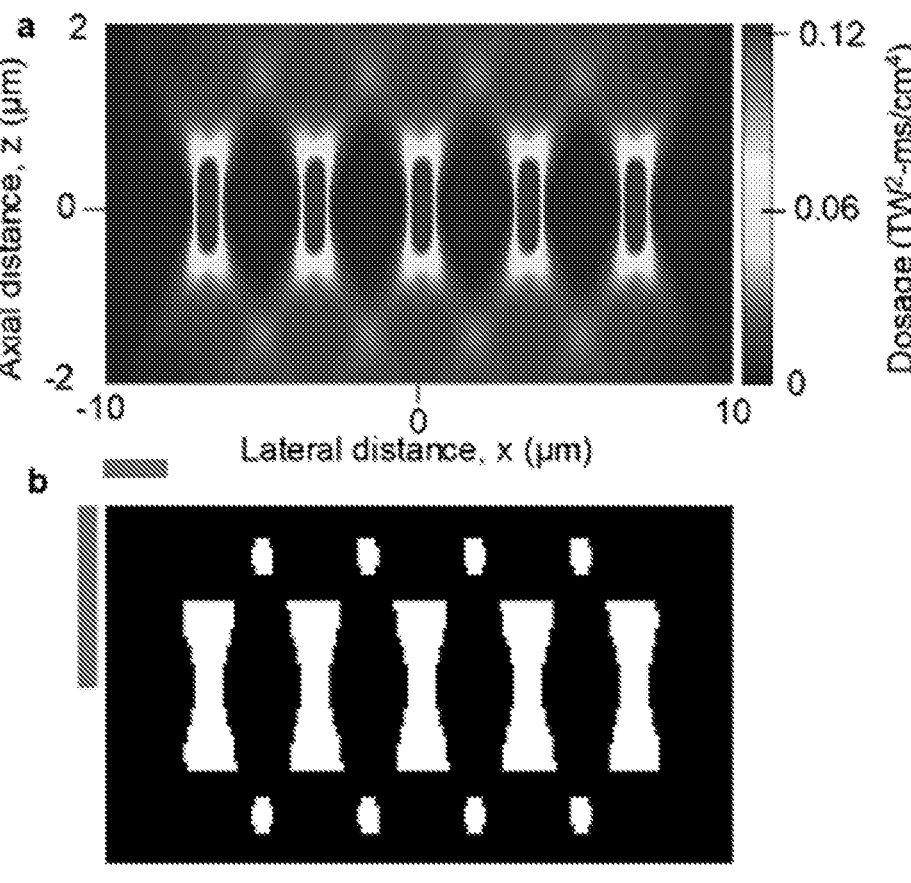
FIGS. 12A-B
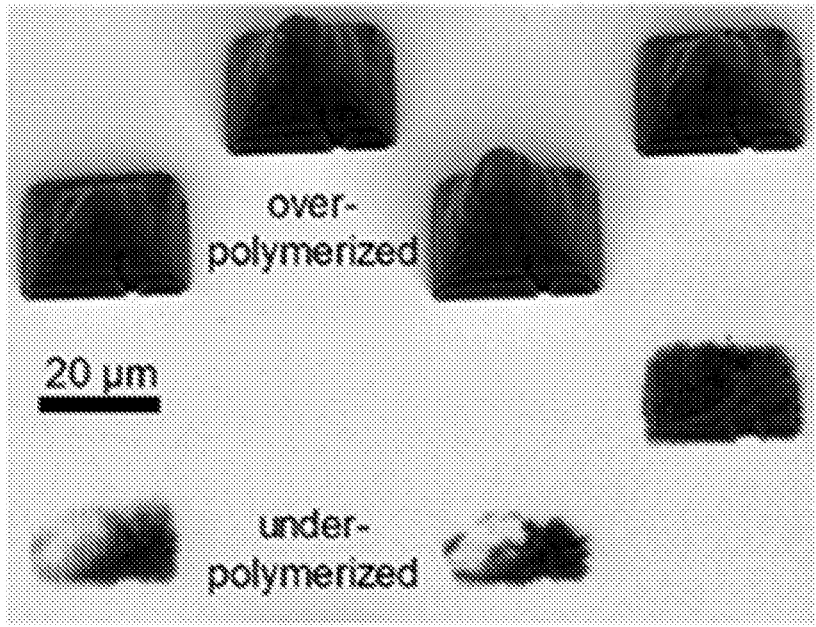
FIG. 13

SYSTEM AND METHOD TO CONTROL DEFECTS IN PROJECTION-BASED SUB-MICROMETER ADDITIVE MANUFACTURING

RELATED APPLICATION

This application is a national stage application filed under 35 U.S.C. § 371 of PCT/US2021/033362 filed May 20, 2021, which claims priority to, and the benefit of U.S. Provisional Patent Application No. 63/027,606 filed May 20, 2020, entitled "System and Method to Control Defects in Projection-Based Sub-Micrometer Additive Manufacturing," which is incorporated by reference herein in its entirety.

BACKGROUND

High-throughput additive manufacturing (AM) techniques with nanoscale resolution are highly desirable for a variety of applications. Two-photon lithography (TPL) is a photopolymerization-based additive manufacturing technique that facilitates fabrication of millimeter scale complex three-dimensional (3D) structures with submicron features. In some implementations, features may be generated on the scale of 100 nm [1]. TPL uses nonlinear photo-absorption from a focused light spot to generate sub-diffraction features through localized photopolymerization [2]. This fine resolution of TPL is widely exploited in fabrication of a variety of functional micro and nanoscale structures such as mechanical and optical metamaterials [3, 4], micro-optics [5], micromachines [6], bio-scaffolds [7], and electrochemical interfaces [8]. The most common implementation of TPL involves serially scanning a tightly focused laser spot in a photopolymer resist to fabricate 3D structures by overlapping the individual submicron volumetric pixels (i.e., voxels) [9]. Despite its unique capabilities, TPL has low throughput, which may have contributed to its slow industrial adoption. For example, printing of foam structures with 300 nm features and a volume of 200 $\mu m^3$ takes several hours using commercially-available TPL 3D printer [10].

A recently developed parallel projection technique, called femtosecond projection TPL (FP-TPL), may be used to scale up TPL process as it increases the throughput up to three orders of magnitude. However, FP-TPL may require tuning of process parameters, including photopolymer material properties, for certain applications to minimize over-polymerization-based defects, particularly for features in nanoscale. In current FP-TPL, the technique may be applied to minimize over-polymerization [14]. However, the design freedom to select a photopolymer resist of choice may not be universally available.

SUMMARY

An exemplary optical projection method and system is disclosed, e.g., femtosecond projection two-photon lithography (FP-TPL) based operation, that applies multiple temporally focused light with reduced density of the projected mask to control over-polymerization defects (e.g., without need to tune the photopolymer composition) when certain aspect ratio of the submicron features are desired. An optical projection operation is disclosed for simulating using optical modeling that is observed to minimize defects resulting from over-polymerization. In some embodiments, the exemplary optical projection method and system is used to reduce the aspect ratio of the submicron features from more than 2 to 1.2 and can provide robust processes suitable for high-throughput high-quality 3D printing of micro and nanoscale structures.

In an aspect, a method is disclosed for performing an additive manufacturing operation to form a structure by processing a photopolymer resist material, the method comprising generating a first temporally focused light sheet onto or within a first region of a photopolymer resist material for a first finite duration of time to cause a first simultaneous polymerization of a first set of selected portions of the photopolymer resist material corresponding to a first selected pattern; and generating a second temporally focused light sheet onto or within a second region of a photopolymer resist material for a second finite duration of time to cause a second simultaneous polymerization of a second set of selected portions of the photopolymer resist material corresponding to a second selected pattern, wherein the first temporally focused light sheet and the second temporally focused light sheet collectively illuminate a continuous region on or in the photopolymer resist material in the depth direction of the photopolymer resist material that includes the first region and the second region.

In some embodiments, the photopolymer resist material illuminated by the first temporally focused light sheet and the second temporally focused light sheet has suppressed occurrences of over-polymerization.

In some embodiments, the photopolymer resist material illuminated by the first temporally focused light sheet and the second temporally focused light sheet, when processed, provides a top surface for a 3D structures that is observable to be flat and uniform.

In some embodiments, each of the first temporally focused light sheet and second temporally focused light sheet is generated by generating a laser beam; directing the laser beam at a tunable mask; collecting at least one emergent beam from a plurality of emergent beams emerging from the tunable mask; collimating the at least one emergent beam to create a collimated beam, wherein each said emergent beam from the tunable mask comprises a plurality of beamlets of varying or identical intensity, and wherein each said beamlet emerges from a unique subsection or region of the tunable mask being illuminated by the laser beam; focusing the collimated beam into the respective first temporally focused light sheet or the second temporally focused light sheet in which each is projected as an image plane onto or within the photopolymer resist material, such that the same optical path length is created between the tunable mask and the focused image plane for all optical frequencies of the focused laser beam; and illuminating a select pattern of subsections on the tunable mask using the focused laser beam for a finite duration of time to cause the simultaneous polymerization of respective select portions of the photopolymer resist material corresponding to the select pattern.

In some embodiments, each of the first simultaneous polymerization and the second simultaneous polymerization is carried for the respective first and second duration at an intensity of light of the focused laser beam which exceeds a threshold dosage for polymerization of the photopolymer resist material.

In some embodiments, the first selected pattern has over 1,000,000 defined pattern region corresponding to a number of actuatable elements of the tunable mask.

In some embodiments, the method further includes simulating the generating first temporally focused light sheet and the generated second temporally focused light sheet In some embodiments, the photopolymer resist material illuminated by the first temporally focused light sheet and the second temporally focused light sheet can produce a submicron structural feature having an aspect ratio between about 1.2 and about 2.0 (e.g., wherein about refers ±5 or ±10%).

In some embodiments, the method further includes receiving, by a processor, a first image having a plurality of pixels corresponding to the first selected pattern; directing, by the processor, the generation of the laser beam; and directing, by the processor, based the first image, the tunable mask to generate the first temporally focused light sheet according the first selected pattern.

In some embodiments, the method further includes receiving, by the processor, a second image having a plurality of pixels corresponding to the second selected pattern; directing, by the processor, the generation of the laser beam; and directing, by the processor, based the second image, the tunable mask to generate the second temporally focused light sheet according the second selected pattern.

In some embodiments, the method further includes supporting the photopolymer resist material on a stage; and moving a focusing elements relative to the stage to write out a layer of the photopolymer resist material; and controllably moving the movable stage (e.g., while the focused laser beam is irradiating the photopolymer resist material and moving the movable stage and/or the focusing elements) to generate a continuous structure.

In some embodiments, the first finite duration of time is the same as the second finite duration of time.

In some embodiments, the first finite duration of time is different from the second finite duration of time.

In some embodiments, the first temporally focused light sheet has an associated first intensity level, wherein the second temporally focused light sheet has an associated second intensity level, and wherein the first intensity level is the same as the second intensity level.

In some embodiments, the first temporally focused light sheet has an associated first intensity level, wherein the second temporally focused light sheet has an associated second intensity level, and wherein the first intensity level is different from the second intensity level.

In some embodiments, the second temporally focused light sheet is illuminated onto or within the second region of the photopolymer resist material at a time after the first temporally focused light sheet has been illuminated onto or within the first region, wherein the time period is sufficient for localized effects of the first temporally focused light sheet to polymerization mechanisms of the photopolymer resist material to be minimized.

In another aspect, a laser-based manufacturing system is disclosed for fabricating non-planar three-dimensional layers, the system comprising a laser for producing a laser beam with a plurality of optical wavelengths; a tunable mask comprising a plurality of optically dispersive elements, each optically dispersive element being configured to receive the laser beam and splitting the beam into a plurality of distinct beam components, wherein each said beam component has spatially separated optical spectral components; an optical assembly configured to collimate the distinct beam components to create a collimated beam and to focus the collimated beam into a focused laser beam which is projected as an image plane onto or within the photopolymer resist material; and a controller operatively coupled to the tunable mask, the controller being configured by instructions to: direct the tunable mask to actuate a first set of plurality of optically dispersive elements to direct the tunable mask to receive a laser beam and split the beam into distinct beam components to be collimated and focused by the optical assembly to generate a first temporally focused light sheet onto or within a first region of a photopolymer resist material, wherein the first temporally focused light sheet is generated onto or within the first region for a first finite duration of time to cause a first simultaneous polymerization of a first set of selected portions of the photopolymer resist material corresponding to a first selected pattern; and direct the tunable mask to actuate a second set of plurality of optically dispersive elements to direct the tunable mask to receive the laser beam and split the beam into distinct beam components to be collimated and focused by the optical assembly to generate a second temporally focused light sheet onto or within a first region of a photopolymer resist material, wherein the second temporally focused light sheet is generated onto or within the first region for a second finite duration of time to cause a second simultaneous polymerization of a first set of selected portions of the photopolymer resist material corresponding to a first selected pattern, wherein the first temporally focused light sheet and the second temporally focused light sheet collectively illuminate a continuous region on or in the photopolymer resist material in the depth direction of the photopolymer resist material that includes the first region and the second region.

In some embodiments, the photopolymer resist material illuminated by the first temporally focused light sheet and the second temporally focused light sheet has suppressed occurrences of over-polymerization.

In some embodiments, the photopolymer resist material illuminated by the first temporally focused light sheet and the second temporally focused light sheet, when processed, provides a top surface for a 3D structures that is observable to be flat and uniform.

In some embodiments, each of the first simultaneous polymerization and the second simultaneous polymerization is carried for the respective first and second duration at an intensity of light of the focused laser beam which exceeds a threshold dosage for polymerization of the photopolymer resist material.

In some embodiments, the tunable mask has over 1,000,000 actuatable elements to produce a corresponding number of defined pattern regions.

In some embodiments, the laser-based manufacturing system further includes a support stage having a surface to support the photopolymer resist material and one or more actuators configured to move a focusing element relative to the stage to write out a layer of the photopolymer resist material.

In some embodiments, the tunable mask comprises micromirrors.

In another aspect, a non-transitory computer readable medium is disclosed having instructions stored thereon, wherein execution of the instructions by a processor cause the processor to receive a first image having a plurality of pixels corresponding to a first pattern to project on and into a photopolymer resist material in an additive manufacturing operation to form a first layer of a structure; receive a second image having a plurality of pixels corresponding to a second pattern to project on and into the photopolymer resist material in the additive manufacturing operation to form the first layer of the structure; direct, based on the first image, the tunable mask to generate a first temporally focused light sheet according the first pattern; and direct, based on the second image, the tunable mask to generate a second temporally focused light sheet according the second pattern, wherein the first temporally focused light sheet is generated onto or within a first region of the photopolymer resist material for a first finite duration of time to cause a first simultaneous polymerization of a first set of selected portions of the photopolymer resist material corresponding to the first pattern; and wherein the second temporally focused light sheet is generated onto or within second region of a photopolymer resist material for a second finite duration of time to cause a second simultaneous polymerization of a second set of selected portions of the photopolymer resist material corresponding to the second pattern, wherein the first temporally focused light sheet and the second temporally focused light sheet are collectively illuminated on or into a continuous region in the photopolymer resist material that includes the first region and the second region.

In some embodiments, the execution of the instructions by the processor further cause the processor to receive a third image having a plurality of pixels corresponding to a third pattern to project on and into a second photopolymer resist material in the additive manufacturing operation to form a second layer of the structure; receive a fourth image having a plurality of pixels corresponding to a fourth pattern to project on and into the second photopolymer resist material in the additive manufacturing operation to form the second layer of the structure; direct, based on the third image, the tunable mask to generate the third temporally focused light sheet according the third pattern; and direct, based on the second image, the tunable mask to generate the fourth temporally focused light sheet according the fourth pattern, wherein the third temporally focused light sheet is generated onto or within a third region of the second photopolymer resist material for a third finite duration of time to cause a third simultaneous polymerization of a third set of selected portions of the second photopolymer resist material corresponding to the third pattern; and wherein the fourth temporally focused light sheet is generated onto or within a fourth region of a photopolymer resist material for a second finite duration of time to cause a fourth simultaneous polymerization of a fourth set of selected portions of the second photopolymer resist material corresponding to the fourth pattern, and wherein the third temporally focused light sheet and the fourth temporally focused light sheet are collectively illuminated on or into a continuous region in the second photopolymer resist material in the depth direction of the photopolymer resist material that includes the third region and the fourth region.

In some embodiments, the photopolymer resist material illuminated by the first temporally focused light sheet and the second temporally focused light sheet has suppressed occurrences of over-polymerization to provide a top surface for the first layer of the structures that is observable to be flat and uniform.

BRIEF DESCRIPTION OF THE DRAWINGS

The accompanying drawings, which are incorporated in and constitute a part of this specification, illustrate embodiments and together with the description, serve to explain the principles of the methods and systems.

Embodiments of the present invention may be better understood from the following detailed description when read in conjunction with the accompanying drawings. Such embodiments, which are for illustrative purposes only, depict novel and non-obvious aspects of the invention. The drawings include the following figures:

FIG. 1 is a diagram of a method to perform an additive manufacturing operation that employs temporal focusing using multiple temporally focused light sheets to form a structure by processing a photopolymer resist material in accordance with an illustrative embodiment.

FIGS. 12A-12B show simulated dosage distribution for a photoresist material exposed using temporal focusing with a single temporally focused light sheet that can produce over-polymerization defects.

FIG. 13 shows examples of over-polymerization defects.

DETAILED SPECIFICATION

Some references, which may include various patents, patent applications, and publications, are cited in a reference list and discussed in the disclosure provided herein. The citation and/or discussion of such references is provided merely to clarify the description of the disclosed technology and is not an admission that any such reference is "prior art" to any aspects of the disclosed technology described herein. In terms of notation, "[n]" corresponds to the nth reference in the reference list. For example, Ref. [1] refers to the 1$^{st}$ reference in the list. All references cited and discussed in this specification are incorporated herein by reference in their entireties and to the same extent as if each reference was individually incorporated by reference.

Example Method of Operations

FIG. 1 is a diagram of a method 100 to perform an additive manufacturing operation to form a structure by processing a photopolymer resist material. The method includes generating (102) a first temporally focused light sheet onto or within a first region of a photopolymer resist material for a first finite duration of time to cause a first simultaneous polymerization of a first set of selected portions of the photopolymer resist material corresponding to a first selected pattern. The method 100 further includes generating (104) a second temporally focused light sheet onto or within a second region of a photopolymer resist material for a second finite duration of time to cause a second simultaneous polymerization of a second set of selected portions of the photopolymer resist material corresponding to a second selected pattern. The first temporally focused light sheet and the second temporally focused light sheet collectively illuminate a continuous region on or in the photopolymer resist material that includes the first region and the second region.

Figure 2:
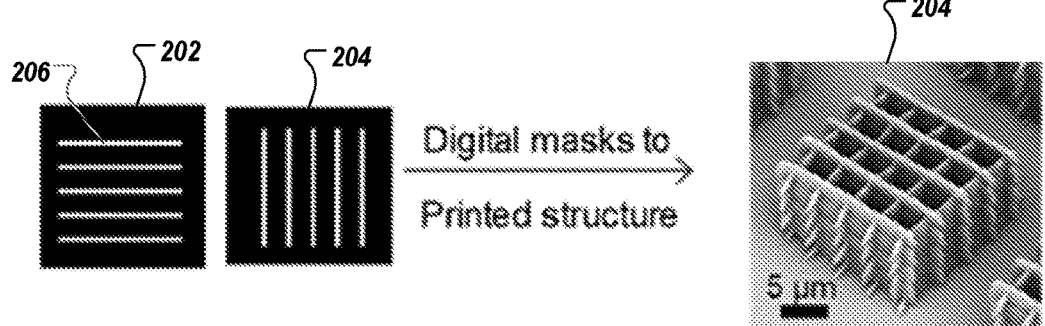
FIG. 2 an example 3D printing operation to form a part from a projection of 2D images and temporally focused light sheets.

FIG. 2 an example 3D printing operation to form a part 204 from a projection of 2D images 202, 204. The system, e.g., later described herein, employs a tunable mask (e.g., 602—see FIG. 6) that is actuatable based on a set of input images (e.g., 202). The system can generate a temporally focused light sheet (604—see FIG. 6) that can expose a pattern in a photoresist material. The photoresist material can be subsequently processed to provide a space 206 to which a structure can be grown. In FIG. 2, the structure is shown as a line structure.

Figure 3:
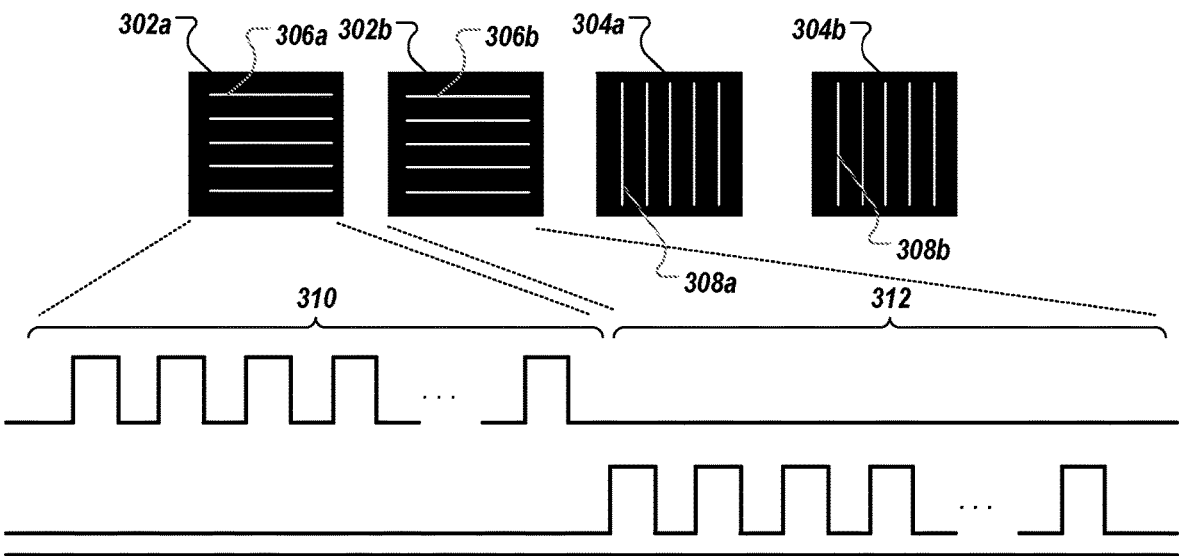
FIG. 3 shows an example operation that employs temporal focusing to generate multiple temporally focused light sheets to reduce over-polymerization defects in accordance with an illustrative embodiment.

FIG. 3 shows an example operation to use multiple temporally focused light sheets that can generate two different projected mask from two sets of input images 302 (shown as 302a, 302b) and 304 (shown as 304a and 304b) each with reduced density to reduce over-polymerization defects.

Temporally focused light sheet refers to the spatial focal region of a beam of light which is in the form of a sheet of thickness less than 10 micrometers and within which the pulse length of the light is minimized. In some embodiments, temporal focusing is applied to produce a femtosecond pulse (e.g., 100 fs or less) and is progressively shortened in conjunction with spatial focusing of the beam. As the peak-intensity during a pulse may depend on both the spatial size of the beam and the duration of the pulse, the intensity can be independently tuned by changing either of these two. The pulse duration may be progressively reduced in proportion to the size of the beam such that the beam is both spatially and temporally focused on or within the interior of the resist material and wherein the location of spatial and temporal focused spots overlaps along the depth of the photoresist material. This can ensure that steep dosage gradients are achieved at the projected image plane even when the projected image is large (due to multiple focused spots). The optical path lengths after the projection mask are designed to match for all optical frequencies in the beam only at the focused image plane but mismatched at all other planes. Thus, temporal focusing stretches the pulse by introducing a "chirp" and selectively minimizes (and ideally eliminates) this chirp only at the focused image plane.

The two or more set of images (e.g., 302a, 302b and 304a, 304b) each having different exposure regions (e.g., first region 306a and the second region 306b are non-overlapping to one another and t region 308a and the second region 308b are non-overlapping to one another) are employed to expose continuous region on a photoresist material. In FIG. 3, the first temporally focused light sheet is illuminuated on the photoresist material during a first time duration 310, and the second temporally focused light sheet is illuminuated on the photoresist material during a second time duration 312. More than two multiple temporally focused light sheets may be employed to generate a given structure.

Figures 4, 5:
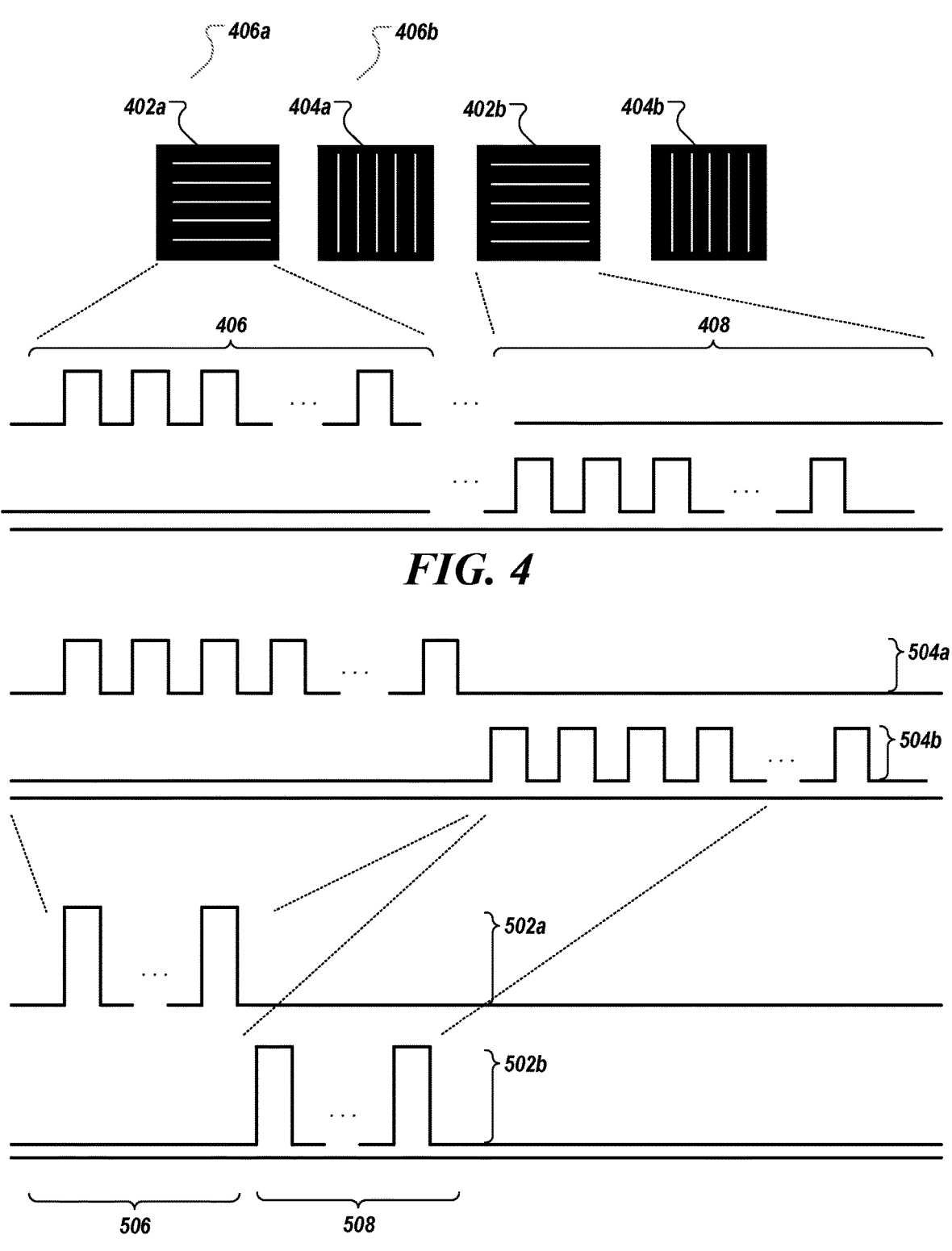
FIG. 4 shows an example operation that employs temporal focusing to generate multiple temporally focused light sheets to reduce over-polymerization defects in accordance with an illustrative embodiment.
FIG. 5 shows an example operation that employs temporal focusing to generate multiple temporally focused light sheets with increased power in accordance with an illustrative embodiment.

FIG. 4 shows another example operation to use multiple temporally focused light sheets that can generate two different projected masks from two or more sets of input images, shown for example as 402 (shown as 402a, 402b) and 404 (shown as 404a and 404b), each with reduced density to reduce over-polymerization defects. In FIG. 3, the multiple temporally focused light sheets for a given structure corresponding to two sets of images 302a, 302b, 304a, 304b are respectively sequenced consecutively to one another (shown as 310 and 312). In FIG. 4, the multiple temporally focused light sheets for a given structure corresponding to two sets of images 402a, 402b, 404a, 404b are sequenced in a collated manner non-consecutively to one another (shown as 406 and 408).

While exposure using multiple temporally focused light sheets can reduce over-polymerization defects, it may affect throughput due to higher exposure time. FIG. 5 shows the use of multiple temporally focused light sheets with increased power of the exposure beam to reduce the overall exposure time. In some embodiments, the exposure time for two or more temporally focused light sheets can be reduced to the same exposure as a single temporally focused light sheets. In other embodiments, the temporally focused light sheets can be adjusted to have a combined exposure time less than two original exposures. In some embodiments, the exposure time for the multiple temporally focused light sheets can be less than a single original exposure.

FIG. 5 shows an example outputs (shown as 502a, 502b) for multiple temporally focused light sheets (shown as 506, 508) having increased power of the exposure beam to provide at least a same exposure dose as a single original exposure (shown via outputs 504a, 504b) over a given time.

In each of the examples of FIGS. 3-5, illumination duration for each of the multiple temporally focused light sheets for a given structure may be the same or different. Similarly, the intensity of the illumination (e.g., power) may be the same or different. These parameters may be adjusted so long as the exposure dose meets a pre-defined threshold for the material.

In addition, in each of the examples of FIGS. 3-5, the subsequent temporally focused light sheet may be applied immediately after the previous temporally focused light sheet or before a sufficient time has passed for localized effects of polymerization mechanisms of the photopolymer resist material to be minimized. In some embodiments, the gap time between a prior and subsequent exposure may be mapped to width size of the exposure (e.g., pixel size of the mask or input image). The mapping may be experimentally determined for a given photopolymer resist material.

The parameters of the multiple temporally focused light sheets may be determined based on a dosage thresholding model, which captures the relevant physics of the polymerization process. The thresholding model may be based on the approximation that the resist material undergoes a localized liquid-to-solid phase transformation when the local dosage exceeds a threshold value for polymerization. In some embodiments, the model for dosage (D) in FP-TPL provides that is can be based on both the intensity of light (I) and the duration of exposure ($t_{exp}$). The model may be expressed in Equation 1:

$$D = I^2 t_{exp} \qquad \text{(Equation 1)}$$

where I is light intensity (TW/cm$^2$), $t_{exp}$ is a duration of exposure during projection of images (ms), and "D" refers to exposure dosage (TW$^2$-ms/cm$^4$).

In Equation 1, the quadratic dependence of dosage on I is consistent with the two-photon absorption process that underlies the FP-TPL process. The dosage model may represent the total number of reactive species (i.e., radicals) generated during illumination and thus can be considered as a measure of light-based "input" to the printing process. In the two-photon absorption process, the amount of light absorbed by the material may be proportional to the square of the intensity whereas the total light absorbed is proportional to the duration of illumination [21]. Based on the dosage thresholding model, printing would be observed in only those regions of the resist where the following relationship holds:

$$D > D_{th} \qquad \text{(Equation 2)}$$

where the dosage threshold $D_{th}$ is a dosage threshold for the onset of polymerization ($TW^2$-ms/cm$^4$) for writing and can be approximated as a material property of the photopolymer resist that does not depend on the light projection technique.

Example System for Femtosecond Projection Two-Photon Lithography

Figure 6:
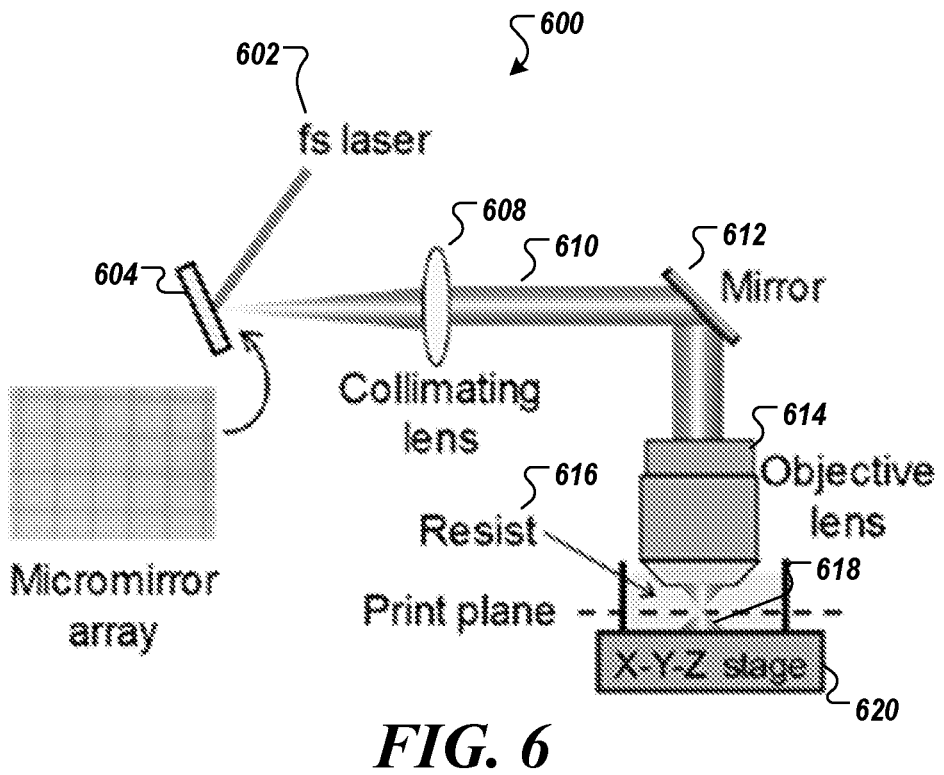
FIG. 6 shows a system configured to employ temporal focusing to generate to generate multiple temporally focused light sheets to form a structure in accordance with an illustrative embodiment.

FIG. 6 shows example schematic of the femtosecond projection two-photon lithography system in accordance with an illustrative embodiment. As shown in FIG. 6, the process may entail projecting an image of a digital mask into the interior of the photopolymer resist by switching the individual pixels (i.e., micromirrors) 'on' or 'off'. The focused light sheet may comprise a 2D point cloud of focused spots wherein each focused spot corresponds to an 'on' point in the digital mask. An arbitrary structures can be printed by loading a sequence of 2D images onto a digital micro-mirror device (DMD). The effect of the density of 'on' pixels in the digital mask on the defects due to over-polymerization observed during printing may then be investigated.

The system 600 may include a pulsed laser source comprising a femtosecond laser (shown as "fs laser" 602) and optical assembly (e.g., comprising a laser amplifier, an optical parametric amplifier ("OPA"), a beam expander, a first high reflective ("HR") mirror, a beam homogenizer, a second HR mirror, a second beam expander). In operation, the laser source 602 may be a pulsed laser source that provides the laser light that drives the writing process.

The laser source 602 is configured to generate pulses with a broad wavelength spectrum instead of a single wavelength. An example of a suitable laser source is a femtosecond Ti-sapphire regenerative laser amplifier with a center wavelength of 800 nm, a pulse duration of 35 fs and a spectral bandwidth of 40 nm.

The light from the laser source 602 may have its wavelength modified by the OPA 14, in one example from 800 nm to either 325 nm or 500 nm, before being further modified by the first beam expander, the beam homogenizer, and the second beam expander. The beam homogenizer may modify the shape of the beam from a non-uniform Gaussian profile to a uniform flat-top beam profile. Beam expanders may control the diameter of a beam that illuminates the digital tunable mask 604.

Multiple beam expanders may be employed, e.g., to individually match the size of the beam to apertures of the various components such as the beam homogenizer and the tunable mask. The tunable mask 604 may be a digital micro-mirror device ("DMD"). This component is commercially available from various manufacturers, for example Texas Instruments Inc. of Dallas, Tex. Alternatively, the tunable mask 602 may be formed by a spatial light modulator (SLM). The tunable mask may also be a strain-driven tunable diffraction grating such as those formed by wrinkling of supported thin films (e.g., see S. K. Saha and M. L. Culpepper, Biaxial Tensile Stage for Fabricating and Tuning Wrinkles, U.S. Pat. No. 9,597,833 B2, March 2017, hereby incorporated by reference in its entirety) or a fixed uniform or non-uniform grating mounted on a movable (rotating and/or translating) mount.

The tunable mask 604 is configured to provide temporal focusing using its dispersive optical element to spatially separate the different optical frequencies (or wavelengths) of the incident beam. DMD, SLM, and tunable wrinkled films can all act as dispersive elements due to their periodic structure which diffracts light. When a laser source is incident onto such a dispersive element, it diffracts into multiple beams. The angular position of the diffracted beams is determined by the modes of diffraction. Each of these diffracted beams contains the full information about illuminated patterned subsections of the tunable mask in the form of individual beamlets that correspond to these subsections. These patterned subsections may correspond to individual mirrors in the DMD or individual peaks of a wrinkled grating wherein these subsections are themselves tunable. If the laser source is a broadband source, the beam lets (and the beams) emerging from the mask diverge instead of being in the form of a single beamlet or beam. This is because the angular position of the diffracted beamlets (and beams) is dependent on the specific wavelength. Due to the inverse relationship between spectral bandwidth and duration of pulse, this spatial divergence (induced by the dispersive mask) stretches the pulse duration and is a feature that facilitates temporal focusing. Tunability of the mask ensures that structures with various feature geometries can be printed. For the following discussion, it will be assumed that the tunable mask 26 is formed by a DMD.

With a DMD used as the tunable mask 604, each micro mirror of the DMD may be viewed as forming a pixel point, and each pixel point can be individually switched on or off. This is accomplished by turning the mirror by a small angular amount between two predetermined positions (often + or −12 degrees). In one predetermined position, the pixel (i.e., micro mirror) forms an "on" state where the intensity of light emerging from the micro mirror pixel via reflection and diffraction along a particular set of directions is high whereas the other predetermined position forms an 'off' state where the intensity of the emergent light along the same set of directions is zero or a low value. Here, the cutoff for the qualitative terms 'high' and 'low' is determined by the specific downstream application. Often, commercially available DMD systems are designed so that the ratio of intensity for the off versus on state along a particular propagation direction is almost zero for incoherent light. This illumination tuning is sufficiently high for two-photon lithography to achieve two different exposure states (high exposure versus zero exposure). For the high exposure state, exposure of the resist through a finite number of laser pulses is sufficient to affect polymerization.

For the low exposure state, the intensity is too low to affect polymerization even with an infinitely large number of pulses due to the thresholding behavior of polymeric resist materials. The beamlets created from each of the "on" micro mirrors in the tunable mask 604 form a diverging beam 606 and collectively form an image created using the tunable mask 604. In some embodiments, only the beamlets created from an "on" pixel within the tunable mask 604 are used to affect polymerization of material within the sample. The rest of the beamlets (i.e., all beamlets emerging from the 'off' pixels) may be re-directed into one or more light sinks. It is important to note that several diffracted beams emerge from the mask and each of these diffracted beams comprises the "on" beamlets. These beams differ in the angular position (diffracted mode) and energy (mode efficiency). For polymerization, it may be preferable to use the beam from only that mode which has the highest diffraction efficiency (i.e., the highest energy). Other modes (beams) may be used for diagnostics or re-directed into light sinks. The additional diffracted beams are not shown in FIG. 6.

The system 600 includes collimating optics 608 (e.g., concave mirror) configured to convert the diverging beam 28 into a collimated beam 610. While the collimating optics 608 in this example is shown as the biconvex lens, other suitable lens or mirror could also be used to provide the needed collimation of the diverging beam 606. The collimated beam 610 may pass also through a neutral density (ND) filter, a short-pass filter, an ETL (none shown).

The collimated beam 610 is reflected by a mirror 612 and focused by an objective lens 612 onto an X-Y plane inside the sample 616, as indicated by focused beam 618. The sample 616 may comprise a photopolymer resist material. This focused X-Y plane (shown as "print plane") is the conjugate plane of the tunable mask 604. An example of an objective lens suitable for use as the object lens is a high numerical aperture but low to moderate magnification oil immersion infinity objective lens (such as a 40×1.4 NA lens).

At the focused image plane on or within the sample, when the laser illumination is held for a finite duration of time, the exposure dosage at each point in the resist that corresponds to the "on" pixel in the tunable mask 604 is higher than the threshold dosage of the material comprising the sample; whereas the exposure dosage at each point in the resist corresponding to an "off" pixel is below the threshold exposure dosage. Thus, a pixelated image of the tunable mask 604 can be formed in an X-Y plane within the sample 616. This enables an entire layer within the sample 616 to be written out in one operation, as the beamlets of the beam 614 from "on" pixels are able to simultaneously write, in parallel, to a large plurality of points (e.g., on the order of $1 \times 10^6$ or more) in one operation. Thus, the ability to form each layer of the sample 616 with a plurality of beamlets that write in parallel enables a dramatic reduction in the time needed to create a finished part from the photopolymer resist material of the sample 616.

Three-dimensional structures may be fabricated by moving the focused image plane relative to the sample 616 using the movable stage 620. In some embodiments, the motion of the movable stage 620 in the X-Y-Z plane may be controlled by an electronic control system (not shown). Alternatively, the movable stage 620 could be a fixedly supported stage (i.e., not movable) while the objective lens 614 is moved within a Z plane as needed. Still further, possibly both the movable stage 620 and the objective lens 614 could be moved simultaneously. The system 600 may include an electronic digital mask control system (not shown) that is operatively connected to the laser source 602, tunable mask 604, objective lens 614, and various actuators for the movable stage 620.

Further, the focal plane of the objective lens 614 may be optically scanned in the axial Z (i.e., depth into the sample) direction using the electrically tunable lens (ETL). The ETL provides the ability to rapidly move the final temporally-focused image plane without any mechanical movement of the objective lens or the movable stage, thereby leading to an increase in rate by as much as a factor of 10. More complex part geometries may be generated by replacing the movable X-Y-Z stage with a 6-axis movable stage that is capable of motions along all six degrees of freedom (e.g., capable of X, Y, Z translations and tip, tilt, and rotation angular displacements).

During temporal focusing, all portions of at least one diverging beam (i.e., one diffracted mode) may be collected by the collimating optics. The gradient of light intensity at the focused image plane reduces if only a part of a diffracted mode is collected, which can lead to a loss of depth resolvability during printing. In addition, partial sections of beams from other diffracted modes may be blocked to minimize intensity variations in the projected image. In addition, to increase the optical transmission efficiency the three elements (laser light, mask, collimating optics) may be arranged such that a blazed grating condition is obtained for the tunable mask 604. A blazed grating condition requires that the light is incident on the blazed tunable mask 604 at a specific angle that is determined by the pixel spacing on the tunable mask, the center wavelength of the laser light beam and the blaze angle of the grating (i.e., the angle by which the mirrors in the DMD are turned). Additional description of the blazed grating condition may be found in Gu, C., Zhang, D., Wang, D., Yam, Y., Li, C., and Chen, S.-C., 2017, "Parallel femtosecond laser light sheet micro-manufacturing based on temporal focusing," Precision Engineering, 50, pp. 198-203, which is incorporated by reference herein in its entirety.

To ensure high-quality printing, the collimating optics 608 may be arranged such that only the diffracted order that corresponds to the blaze condition is collected. In some embodiments, the collimating optics 608 may be positioned at a predetermined angle to the face of the tunable mask 604 and to block the other orders by introducing apertures. This can set a condition on the maximum angular aperture. Additionally, all of the wavelengths (within the bandwidth of the laser source 602) may be collected by the collimating lens 608. As the different wavelengths emerge at (slightly) different angles, this condition may set a minimum angular aperture for the collimating optics. Thus, the angular aperture over which the beamlets of the beam may be collected onto the collimating optics 608 may lie within a small band. Outside this band, the performance of the system 600 may drop significantly. Although the aperture-based design feature may appear an obvious design goal in light of this disclosure, past attempts at parallelizing multiphoton lithography using similar optical configurations have failed to demonstrate 3D depth resolvability (see Mills et al., supra) thereby suggesting that designing and configuring an optical system that is capable of depth-resolved parallel multiphoton lithography is non-trivial even when the system uses known components.

It is noted that these past attempts have been successful in melting-based machining operations despite failing in implementing polymerization-based depth-resolved multiphoton lithography. Thus, success in thermally-driven machining processes does not automatically guarantee that the underlying system could also successfully 3D print depth-resolved polymeric structures.

The system 600 may be used to perform grayscale printing operation to which high-quality parts can be fabricated. The grayscale printing operation may include a sequence of operations and the selection of writing conditions in these operations that leads to a non-uniform "dosage" during printing within the same projected image plane. The term "dosage" refers to the combined nonlinear effect of light intensity and duration of light exposure (in the form dosage= $(\text{intensity}^2 \times \text{time})$. Writing occurs at a point when the dosage at that point is above a threshold value ("threshold dosage") for a given photopolymer resist material. For writing, a pixel must be continuously switched "on" for a duration of time that is longer than the threshold exposure time at the incident light intensity (represented by the horizontal or vertical lines in FIGS. 3-5). Non-uniform dosage can be achieved by selectively switching some pixels on or off to selectively increase or decrease the nonlinear dosage within the plane of the resist material. In some embodiments, a series of patterns (i.e., map of pixel "on" and "off" states as shown herein) may be sent to the DMD and holding each of the patterns for finite durations of time. These pattern illumination durations would then be shorter than the maximum exposure time required for any spot within the field of projection. The net nonlinear dosage at any point within the resist material is the cumulative combined dosage from each projected image. Here, the field of projection refers to the maximum area of any focused image that can be projected onto/into the resist material. Thus, one may need to project a series of non-intuitive DMD patterns to print the desired structure at the focused plane through a process of sequentially projecting several DMD patterns and nonlinearly and cumulatively combining the effect of illumination intensity and duration of illumination.

The range over which the net dosage can be tuned through this method may be limited by the shortest duration that a pixel can be switched on and the rate at which the power of the incident beam can be tuned. The shortest duration that a pixel can be switched "on" may be determined by the pulse repetition rate of the laser source 602. Grayscale control can facilitate the tuning of the total exposure time of each pixel between zero and the maximum required duration in steps of the reciprocal of pulse repetition rate. For example, if a projection field requires a maximum of 20 pulses, then with a laser source at a pulse repetition rate of 1 kHz the exposure time can be discretely tuned between 0 and 20 ms in steps of 1 ms. This may be achieved by loading a new single-bit image onto the DMD 26 every 1 ms. The dosage can be further tuned if a high-speed (i.e., faster than ~10 ms response time) beam power control unit is incorporated into the system. Without the additional power control unit, the dosage can be discretely controlled over several grayscale levels that are separated by the reciprocal of pulse repetition rate. Beam power control may be used to provide finer dosage control than this. It is noted that the grayscale method for dosage control disclosed here is distinct from the intensity control schemes of commercial DMD masks (i.e., projectors). In commercial DMD projectors, time-averaged intensity of a pixel can be controlled over several levels by changing the ratio of rate at which the mirrors are switched between on and off states while the mirrors are continuously cycled between on and off states.

It has also been experimentally observed that the threshold dosage depends on the proximity of features within the sample 616. There may be a minimum threshold exposure time required to affect polymerization in the resist material when illuminated with specific peak intensity and for different feature spacings. In a sample part that contains closely spaced and sparsely spaced features, providing a uniform dosage may lead to over or under exposure-based defects. The grayscale dosage control of the grayscale printing operation may provide for non-uniform control of dosage in the same focused plane. This can be implemented using the pulsed nature of the laser light from the laser source 602 and the multi-pulse exposure threshold behavior of the material that makes up the sample 616. Traditionally, one would keep projecting one image per focused plane within the sample 616 until the desired uniform dosage is obtained at the particular plane within the sample. But with the present method, a distinction may be that instead of projecting the same image, multiple images may be sequentially projected at the same image plane. The digital image being created is altered so that the pixels of the tunable mask 604 at which the local dosage exceeds the non-uniform dosage threshold are switched off in the subsequent images.

The tuning of the sequential images at the same image plane in the sample 616 may either be performed by prior experimental calibration of dosage laws or in real-time by optically sensing the curing process through changes in contrast of images captured by a real-time imaging system. The optical sensing system may include a separate illumination lamp but shares the same focusing elements as the processing system to generate an image of the processing plane on the camera to provide live imaging and recording of the printing process. To ensure that the optical sensing/visualization system does not interfere with the printing process, the wavelength of illumination in this system is selected to lie outside the absorption spectrum of the resist material.

Thus, the grayscale dosage control technique described herein, as implemented by producing a plurality of sequential images at the same image plane, but with different dosages for each pixel of the image, enables printing of non-uniform parts without generating defects due to over or under-exposure. In particular, the printing of non-uniform parts having closely spaced but differing features, is now possible.

Additional description of the system 600 may be found in U.S. Publication No. 2021/0001540, which is incorporated by reference herein in its entirety.

Over-Polymerization Defects

FP-TPL technique enables projecting an entire 2D layer at once by temporally focusing the light into a thin focused light sheet. Specifically, during temporal focusing, the femtosecond pulse is stretched and compressed along the optical path to obtain intensity gradients in the photoresist. Polymerization occurs in those regions of the photoresist where the dosage exceeds a threshold value. Thus, strong intensity gradients along the depth direction enable one to print thin submicron 2D layers. 3D structures are generated by moving the focused light sheet and the photoresist relative to each other.

FIG. 13 shows defects during printing of a log-pile cuboid structure with an expected flat top surface wherein undesirable over-polymerization leads to a domed top [18]. Upon comparing the over-polymerized defective structures in FIG. 13 with the defect-free structure of FIG. 2, it can be observed that the defects manifest as over-polymerization in the central region of the projected planes. In both cases (i.e., FIG. 13 and FIG. 2), the same set of 2D images were projected on the DMD. These images are shown on the left side of FIG. 2. When over-polymerization is absent, the top surface of the 3D structures is observed to be flat and uniform. However, the top surface of the over-polymerized structures is domed and extends beyond the plane of projection. In the past, it is observed that the composition of the photopolymer resist material can be tuned so its thresholding behavior can suppress the over-polymerization. The uniform printing shown in FIG. 2 was achieved through such material optimization [14]. In the instant disclosure, the suppression of over-polymerization is through a modification of the optical projection.

Optical Modeling of FP-TPL

A temporally-focused light intensity distribution was obtained by simulating the propagation of a broadband femtosecond pulse through the optical system. The optical system consists of the DMD and the print plane inside the photopolymer resist being arranged in a 4f-like arrangement. This arrangement is illustrated in FIG. 3. The 4f-like arrangement refers to the orientation in which the DMD plane and the print plane are conjugate image planes of each other, i.e., the two lenses generate a de-magnified image of the DMD plane on the print plane inside the resist. In addition, this 4f-like arrangement also enables temporal focusing, i.e., focusing of the pulses in the time domain.

Figure 7:
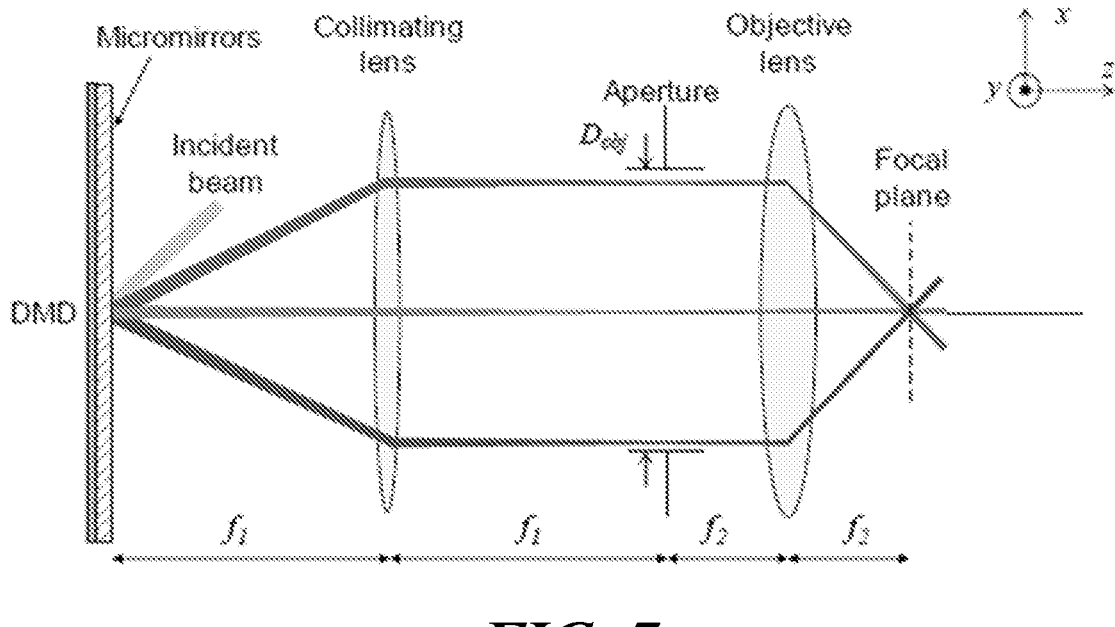
FIG. 7 shows an example schematic of an optical system for femtosecond projection that implements temporal focusing.

FIG. 7 shows example schematic of the optical system for femtosecond projection that implements temporal focusing. The DMD surface and the focal plane of the objective lens are conjugate planes in a 4f-like arrangement between the collimating lens and the objective lens [14].

To simulate the intensity of light in the focal volume of the resist, the electric field for each wavelength using monochromatic coherent optical models were first separately evaluated and then the contribution of each wavelength summed up to compute the light intensity in the focal volume. Light propagation through the optical system was modeled through the following steps: (i) the DMD surface is illuminated by a uniform beam, (ii) the DMD pattern acts as an amplitude mask that modifies the field amplitude, (iii) the periodic DMD structure acts as a diffraction grating that introduces a linear wavelength-dependent phase shift, (iv) the collimating lens generates an image of the DMD plane on the back focal plane of the objective lens, and (v) the objective lens focuses this image into the resist material to generate the temporally focused light sheet. These propagation steps were mathematically represented using Fourier optics and computationally modeled using the MATLAB software package. A grid of 256×256 pixels was used to simulate the DMD structure. In this grid representation, each pixel represents a single micromirror. The pixel spacing in this grid was set equal to the physical micro-mirror spacing of the DMD (i.e., equal to 7.6 μm). The details of the intensity modeling technique are available elsewhere [14].

A representative intensity profile for projection of line features is shown in FIG. 4. Upon projection of linear features on the x-y plane of the DMD, a de-magnified image of the lines is generated on the focal plane of the photoresist. This image is focused in the depth direction, i.e., intensity is highest at the z=0 plane but falls off away from that plane. Such an intensity distribution would generate a 3D linear feature of a finite width and a finite height. In these simulations, the refractive index of the photoresist material has been set to 1.52 which is same as that of the immersion oil medium of the objective lens (60×1.25 NA). Simulation was performed for a Ti-sapphire femtosecond laser with a center wavelength of 800 nm and a spectral bandwidth of 40 nm. The focal length of the collimating lens was set at 200 mm and the focal length of the objective lens was 3 mm. These optical parameters were selected to match the experimental conditions of our past work [14].

Figures 8A, 8B, 8C:
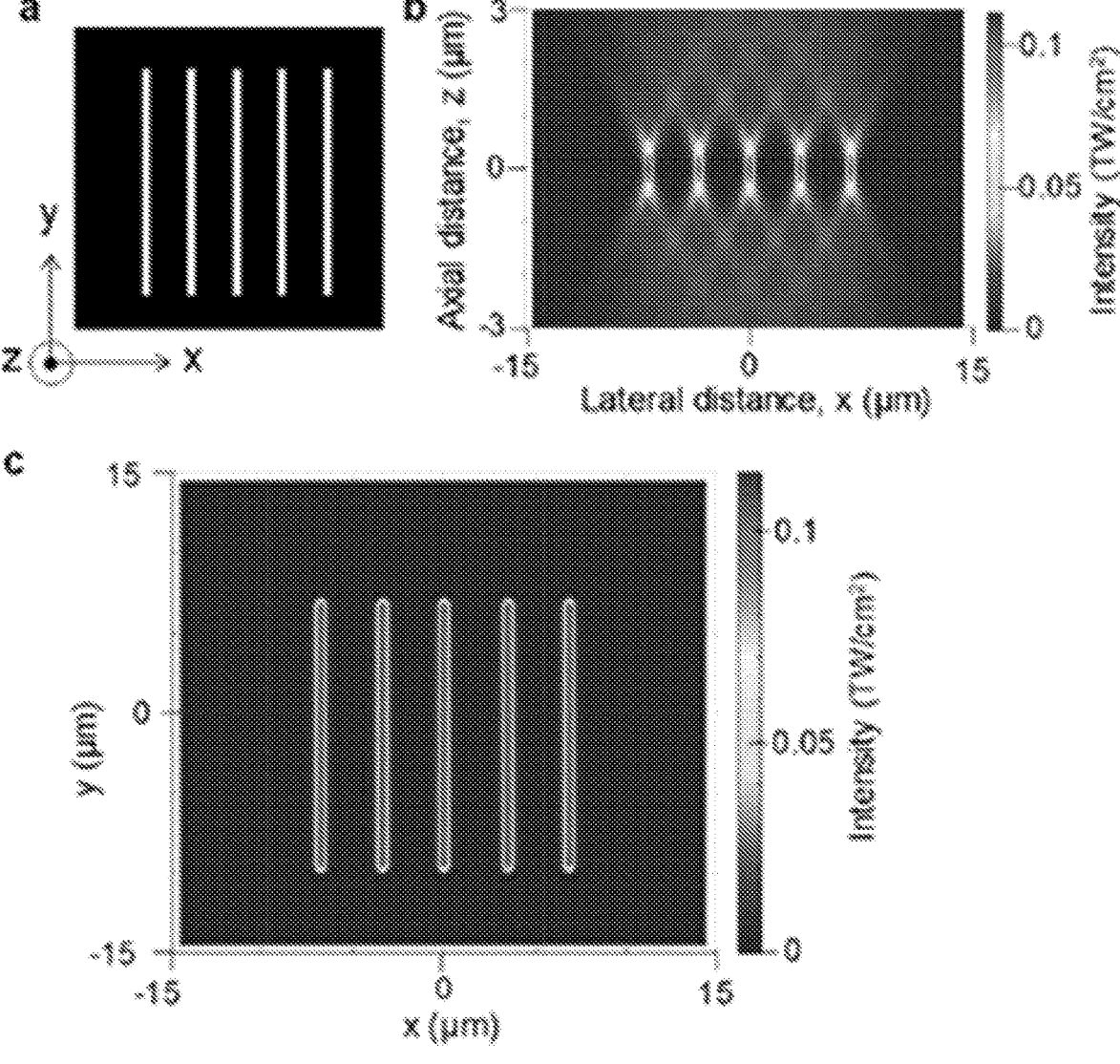
FIGS. 8A, 8B, and 8C show simulation of an optical modeling for femtosecond projection that implements temporal focusing.

FIGS. 8A, 8B, and 8C show simulations of an optical modeling for femtosecond projection that implements temporal focusing. Specifically, FIGS. 8A and 8B show simulation of an optical modeling of FP-TPL. In FIG. 8A, a bitmap image is shown of linear features projected on a DMD with a uniform line width of 4 pixels. FIG. 8B shows simulated light intensity distribution within the focal volume at the y=0 plane inside the resist. FIG. 8C shows simulated light intensity distribution within the focal volume at the z=0 plane (i.e., the focal plane) inside the resist.

Thresholding Model

To identify the source of the over-polymerization-based defects, the process parameters may be related to the size of the polymerized features. Prediction of the feature sizes during FP-TPL may be made via modeling of both the intensity distribution in the resist material and the subsequent polymerization reactions. A dosage thresholding model was developed to capture the relevant physics of the polymerization process and used the results of the optical model as an input to this thresholding model. The results from this combined model were used to evaluate the effect of pixel density on the over-polymerization defects. The model may also be used to adjust the multiple temporally focused light sheets.

The thresholding model may be based on the approximation that the resist material undergoes a localized liquid-to-solid phase transformation when the local dosage exceeds a threshold value for polymerization. Early work in the field of serial TPL [19] suggests that the thresholding approach may accurately predict feature sizes; however, more recent work suggests that more elaborate time-dependent models are necessary to fully capture the reaction-diffusion behavior of TPL [20].

In some embodiments, the model for dosage (D) in FP-TPL provides that is can be based on both the intensity of light (I) and the duration of exposure ($t_{exp}$). The model may be expressed in Equation 1. Due to the two-photon absorption process, the amount of light absorbed by the material may be proportional to the square of the intensity whereas the total light absorbed is proportional to the duration of illumination [21]. Therefore, the number of reactive species can be obtained by multiplying $I^2 t_{exp}$ with an appropriate absorption coefficient of the photoresist material [19]. This multiplier was dropped from the definition of dosage in Eq. 1 as the thresholding model was observed to be insensitive to this parameter. Based on the dosage thresholding model, printing would be observed in only those regions of the resist where the following relationship holds in Equation 2.

Experimental Results

Pixel density dependent background intensity. A study was conducted to model the light intensity distribution for a set of projected images to study the effect of the density of pixels on the defects observed during FP-TPL. Each projected image comprises a set of 5 lines of the same width (in pixels) and a fixed period. The line width was varied across the different images from 3 to 10 pixels and the period was held at 30 pixels for all images. The magnification of the optical system is such that each pixel on the DMD maps to an area of 113 nm×113 nm on the focal plane in the resist. The effect of line width on intensity is illustrated in FIG. 9.

Figure 9:
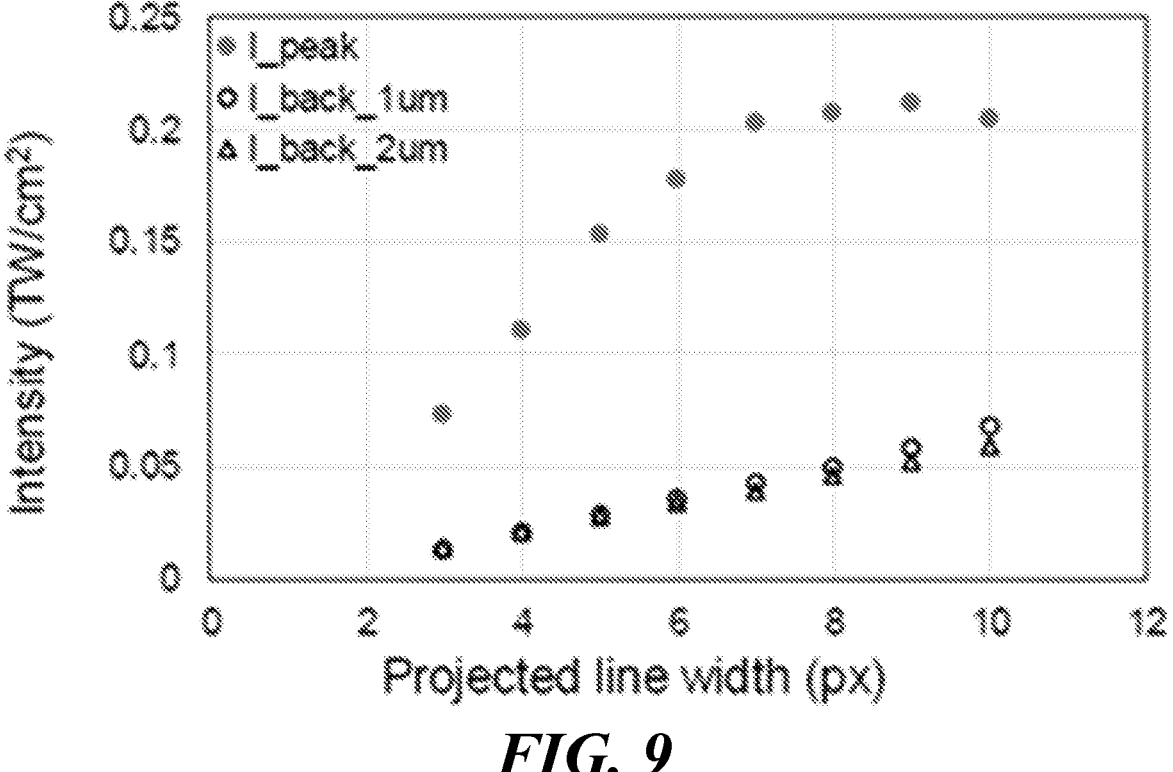
FIG. 9 shows simulated results for femtosecond projection that implements temporal focusing.

FIG. 9 shows simulated results for femtosecond projection that implements temporal focusing. Specifically, FIG. 9 shows simulated intensity versus projected line width. In FIG. 9, I_peak is the peak intensity of the central feature at z=0, I_back_1 um is the maximum intensity on the z=1 μm plane and I_back_2 um is the maximum intensity on the z=2 μm plane.

It was observed that the highest intensity is achieved at the focal plane (e.g., at z=0 plane) but a finite non-zero background intensity also exists on the planes above and below the focal plane. This background intensity increases with an increase in the projected line width, e.g., with an increase in the density of 'on' pixels in the image. Over-polymerization may occur if the dosage corresponding to this background intensity exceeds the threshold dosage. This over-polymerization effect would be less dominant for images with thinner projected features. This hypothesis has been tested by simulating the printing of features using the dosage thresholding model represented by Eqs. 1 and 2.

Feature size prediction. The study simulated the size of the printed features for two different line widths: 4-pixel and 8-pixel wide lines. The exposure time for each image was 10 ms and the dosage threshold ($D_{th}$) was set equal to 0.025

$TW^2$-ms/cm$^4$. This value of the dosage threshold was obtained by calibrating the model so that a 4-pixel wide line would generate a 450 nm wide printed feature. The dosage distribution and the printed features for the two cases are shown in FIGS. 10 and 12.

The width of the printed feature at the focal plane (z=0 plane) for the 8-pixel wide line is observed to be 900 nm. Although this width scales with the projected pixel linewidth (i.e., it is twice that obtained for 4-pixel wide line), over-polymerization on the planes away from the focal plane is observed for the 8-pixel case.

Control of over-polymerization defects. As the amount of over-polymerization defect scales with the width of the projected line, it is reasonable to expect that these defects can be minimized by printing wider features through a series of thin lines. Here, this hypothesis had been tested by projecting a sequence of two images wherein each image has 4-pixel wide lines, but the two sets of lines are offset from each other by 4 pixels along the x axis. Upon projection, the illuminated region spans a width of 8 pixels wherein the 4 pixels on the left-half are illuminated during the first exposure step and the 4 pixels on the right-half are illuminated during the second exposure step. The net dosage distribution was evaluated by summing up the dosage values for the two exposure steps. Each exposure step lasted 10 ms and the same $D_{th}$ was used. The net dosage and the simulated features for this projection scheme are shown in FIG. 8. Table 1 shows a comparison of simulated feature size under different projection operations.

TABLE 1

| Projection Type | Line Width (nm) | Line height (nm) | Aspect ratio |
|---|---|---|---|
| 4 px lines | 450 | 900 | 2 |
| 8 px lines | 900 | 1900 | 2.1 |
| 4 px + 4 px (instant) | 900 | 1100 | 1.2 |

Figures 10A, 10B:
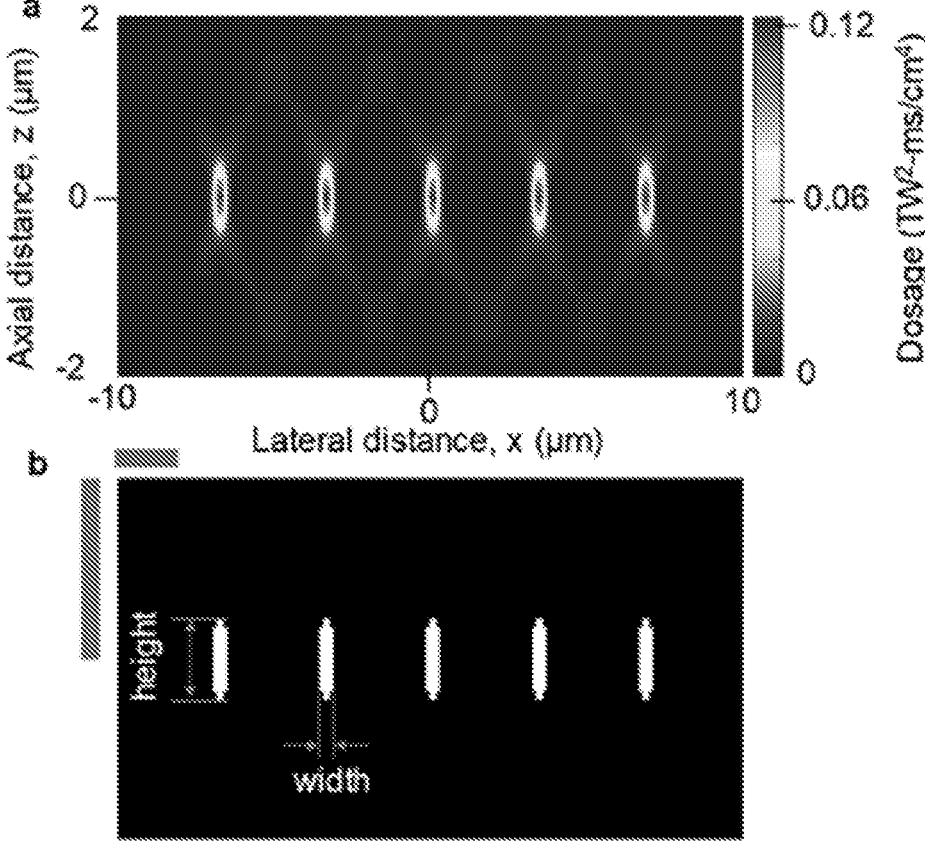
FIGS. 10A-10B show simulated dosage distribution for a photoresist material exposed using temporal focusing with a single temporally focused light sheet that does not produce, or reduce, over-polymerization defects.

FIGS. 10A-10B show simulated dosage distribution for a photoresist material exposed using temporal focusing with a single temporally focused light sheet that does not produce, or reduce, over-polymerization defects. In FIG. 10A, simulated dosage distribution is shown within the resist upon projection of 4-pixel wide lines. FIG. 10B shows simulated printed features represented by the white regions. Scale bars in (b) along x and z are 2 μm long.

FIGS. 12A-12B show simulated dosage distribution for a photoresist material exposed using temporal focusing with a single temporally focused light sheet that can produce over-polymerization defects. In FIG. 12A, simulated dosage distribution is shown within the resist upon projection of 8-pixel wide lines. FIG. 12B shows simulated printed features. Scale bars in (b) along x and z are 2 μm long.

Figures 11A, 11B:
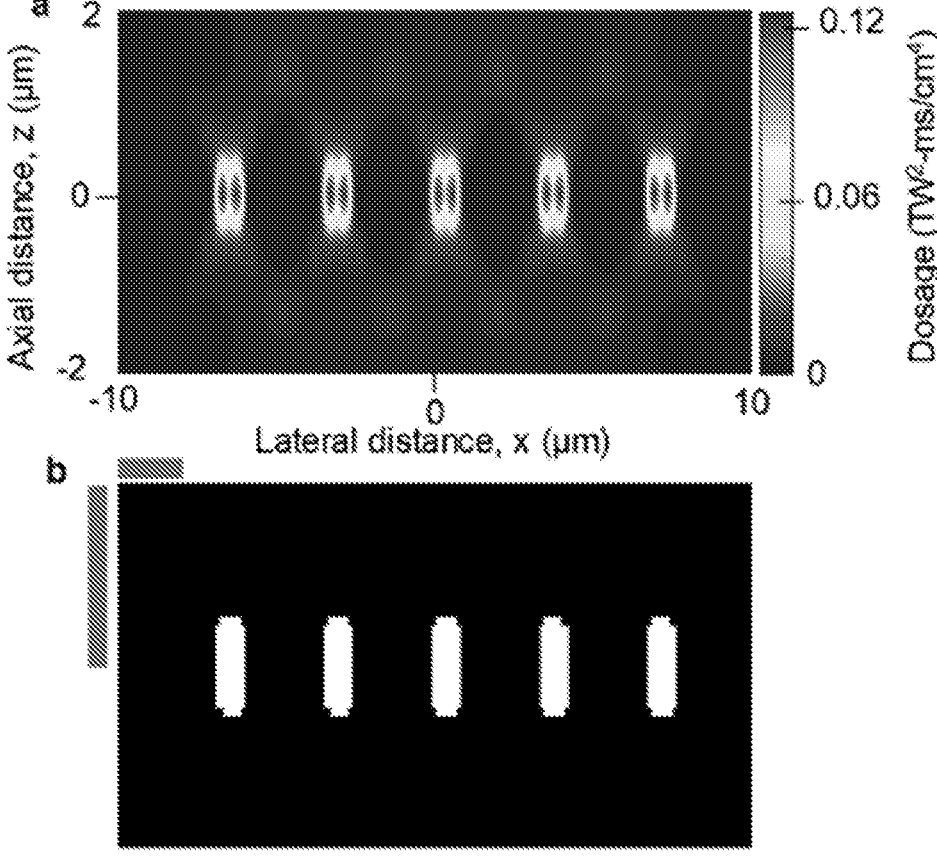
FIGS. 11A-11B show simulated dosage distribution for a photoresist material exposed using temporal focusing with multiple temporally focused light sheets that does not produce, or reduce, over-polymerization defects.

FIGS. 11A-11B show simulated dosage distribution for a photoresist material exposed using temporal focusing with multiple temporally focused light sheets that does not produce, or reduce, over-polymerization defects. In FIG. 11A, the simulated dosage distribution is shown within the resist upon projection of two sets of 4-pixel wide lines wherein the second set is offset from the first set by 4 pixels along the x axis. FIG. 11B shows simulated printed features. Scale bars in (b) along x and z are 2 μm long.

With the multiple temporally focused light sheet projection operation, the exemplary method employed thinner projected lines to generate thicker features, the width of the linear feature was still the same as that obtained for the 8 px projection. However, the feature height was observed to be reduced by 40%. In addition, the multiple temporally focused light sheet projection operation was observed to minimize the over-polymerization defects away from the focal plane and reduced the aspect ratio of the features (height/width) from more than 2 to 1.2. Thus, it can be an optimal projection technique when high-quality and fine features are desired. Though it can reduce throughput due to the higher exposure time (e.g., in the experiment, 20 ms) required to project two images instead of a single image, the operation can be addressed by increasing the power of the beam so that the total exposure remains unchanged, e.g., as described in relation to FIG. 5.

Extensions of the model. In the study, the instant model approximated the polymerization process through a thresholding mechanism. For more comprehensive predictions, the dynamics of the polymerization mechanism may be incorporated. Specifically, the spatiotemporal evolution of the diffusion of chemical species and the reaction of the chemical species may be accounted for to improve certain predictions. Including these effects may provide estimate as to the gap time between multiple temporally focused light sheet projection operation. Nevertheless, the model presented here is sufficiently accurate to demonstrate that the defects due to over-polymerization are dependent on the density of the 'on' pixels in the projected image and can be minimized by projecting thinner features.

Discussion

Several approaches have been used in the past to scale up TPL. These approaches include, increasing the linear writing speed of the serial scanning process [11], parallelizing the process using holographic techniques [12], and parallelization through projection of 2D images [13]. With increasing writing speed, the duration of exposure at the focal spot keeps decreasing, thereby requiring progressively more sensitive photopolymer resists. Improving the fabrication throughput via parallelization has been challenging without compromising the resolution and/or the pattern complexity. For example, some past attempts at parallelizing TPL via projection of images from tunable digital masks have failed to achieve the submicron depth-resolution that is routinely achievable in serial writing [13]. Holographic methods developed to generate and scan multiple focal spots simultaneously [12] cannot fabricate arbitrary structures, so they are mostly suitable for printing periodic structures.

The instant femtosecond projection TPL (FP-TPL) technique can increases the throughput up to three orders of magnitude without compromising the submicron resolution. Although FP-TPL significantly scales up the process, it requires tuning of the process parameters to minimize defects due to over-polymerization. These process parameters include the relevant material properties of the photopolymer resist. Tuning of the photopolymer composition to achieve the desired printing quality is an approach that has been used extensively in the past for TPL [15-17]. In current FP-TPL, the technique may be applied to minimize over-polymerization [14]. However, the design freedom to select a photopolymer resist of choice may not be universally available. Therefore, it is important to identify whether control of defects is possible through control of the projection technique alone without resorting to tuning of the photopolymer. Here, a modified projection technique is presented that enables suppression of over-polymerization.

Present technologies for making complex 3D micro and nanoscale structures are limited to point-by-point writing techniques that are very slow. For example, printing a millimeter cube of material can take up to 100 hours to print. Thus, many promising devices that use these structures cannot be printed at the high throughputs (i.e., rates) required to scale them up for industrial use. FP-TPL 3D printing technique improves upon printing technologies by increasing the rate by a thousand times without comprising the sub-micrometer feature size resolution. The instant disclosure improves upon the FP-TPL 3D printing process by reducing defects during printing thereby improving yield and reducing time and cost wastage.

FP-TPL technology may be used in 3D printing system as well as nano-scale printing applications. Nano 3D printing is as an emerging market that is expected to grow in the near future due to demand for nano-enabled energy products within the automotive and electronics industries.

At present, nano 3D printing lacks wide adoption by end users, making it a niche area within advanced manufacturing. Commercial systems (such as from Nanoscribe GmBH) are limited by their low printing rate (~0.1 mm3/hr). In comparison, the FP-TPL technology increases the rate by 1000× that opens up access to system users that were previously not seriously considering nano 3D printing.

Indeed, high-throughput nanoscale additive manufacturing techniques are highly desirable for a variety of applications. The recently developed FP-TPL technique presents this capability for polymerization-based processing. However, defect-free writing requires one to iteratively tune the material properties of the photopolymer resist. Here, a dosage thresholding model was used to demonstrate that over-polymerization-based defects are dependent on the density of the 'on' pixels in the projected image and can be minimized by projecting a sequence of thinner features. Thus, this modified projection technique can be used to control the defects in FP-TPL purely through optical techniques without requiring one to modify the photopolymer resist. Through simulations, reduction in the amount of polymerization on planes away from the focal plane has been demonstrated along with a decrease in the height of the features by 40% and a reduction in the aspect ratio from more than 2 to 1.2. Thus, this optimal projection strategy transforms FP-TPL into a more robust process suitable for high-throughput high-quality 3D printing of micro and nanoscale structures.

The instant disclosure includes a system and method of improving the printing quality in sub-micrometer additive manufacturing based on the femtosecond projection two-photon lithography (FP-TPL) techniques. FP-TPL was co-invented by the inventor and it improved upon the prior art by increasing the printing rate by up to a thousand times. The instant disclosure improves on quality of printing in FP-TPL by altering the light projection technique. This specific alteration can facilitate printing of well-defined structures without excess printing that is commonly observed during FP-TPL. Thus, it facilitates the printing of defect-free structures and broadens the applicability of FP-TPL to printing of functional micro and nanoscale structures.

Description of the FP-TPL and other additive techniques, among other processes and system, that may employ the instant system and method includes:

[A] Saha, S. K., Wang, D., Nguyen, V. H., Chang, Y., Oakdale, J. S., & Chen, S.-C. (2019). Scalable submicrometer additive manufacturing. Science, 366(6461), 105-109. https://doi.org/10.1126/science.aax8760;

[B] S. K. Saha, R. M. Panas, S. C. Chen, System and Method for Submicron Additive Manufacturing, U.S. Non-provisional application Ser. No. 15/857,917, Filed December 2017; and

[C] S. K. Saha, R. M. Panas, S. Chen, System and Method for Depth Resolved Parallel Two-Photon Polymerization for Scalable Submicron Additive Manufacturing, PCT/US17/59326, Filed October 2017. Each of which is incorporated by reference herein in its entirety.

It should be appreciated that any of the components or modules referred to with regards to any of the present embodiments discussed herein, may be integrally or separately formed with one another. Further, redundant functions or structures of the components or modules may be implemented. Moreover, the various components may be communicated locally and/or remotely with any user/clinician/patient or machine/system/computer/processor.

Moreover, the various components may be in communication via wireless and/or hardwire or other desirable and available communication means, systems and hardware. Moreover, various components and modules may be substituted with other modules or components that provide similar functions.

Although example embodiments of the present disclosure are explained in some instances in detail herein, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "5 approximately" one particular value and/or to "about" or "approximately" another particular value. When such a range is expressed, other exemplary embodiments include from the one particular value and/or to the other particular value.

By "comprising" or "containing" or "including" is meant that at least the name compound, element, particle, or method step is present in the composition or article or method, but does not exclude the presence of other compounds, materials, particles, method steps, even if the other such compounds, material, particles, method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the present disclosure. Similarly, it is also to be understood that the mention of one or more components in a device or system does not preclude the presence of additional components or intervening components between those components expressly identified.

As discussed herein, a "subject" may be any applicable human, animal, or other organism, living or dead, or other biological or molecular structure or chemical environment, and may relate to particular components of the subject, for instance specific tissues or fluids of a subject (e.g., human tissue in a particular area of the body of a living subject), which may be in a particular location of the subject, referred to herein as an "area of interest" or a "region of interest."

It should be appreciated that as discussed herein, a subject may be a human or any animal. It should be appreciated that an animal may be a variety of any applicable type, including, but not limited thereto, mammal, veterinarian animal, livestock animal or pet type animal, etc. As an example, the animal may be a laboratory animal specifically selected to have certain characteristics similar to human (e.g., rat, dog, pig, monkey), etc. It should be appreciated that the subject may be any applicable human patient, for example.

Some references, which may include various patents, patent applications, and publications, are cited in a reference list and discussed in the disclosure provided herein. The citation and/or discussion of such references is provided merely to clarify the description of the present disclosure and is not an admission that any such reference is "prior art" to any aspects of the present disclosure described herein. In terms of notation, "[n]" corresponds to the nth 10 reference in the list. All references cited and discussed in this specification are incorporated herein by reference in their entireties and to the same extent as if each reference was individually incorporated by reference.

The term "about," as used herein, means approximately, in the region of, roughly, or around. When the term "about" is used in conjunction with a numerical range, it modifies that range by extending the boundaries above and below the numerical values set forth. In general, the term "about" is used herein to modify a numerical value above and below the stated value by a variance of 10%. In one aspect, the term "about" means plus or minus 10% of the numerical value of the number with which it is being used. Therefore, about 50% means in the range of 45%-55%. Numerical ranges recited herein by endpoints include all numbers and fractions subsumed within that range (e.g., 1 to 5 includes 1, 1.5, 2, 2.75, 3, 3.90, 4, 4.24, and 5).

Similarly, numerical ranges recited herein by endpoints include subranges subsumed within that range (e.g., 1 to 5 includes 1-1.5, 1.5-2, 2-2.75, 2.75-3, 3-3.90, 3.90-4, 4-4.24, 4.24-5, 2-5, 3-5, 1-4, and 2-4). It is also to be understood that all numbers and fractions thereof are presumed to be modified by the term "about."

The following patents, applications and publications as listed below and throughout this document are hereby incorporated by reference in their entirety herein.

REFERENCES

[1] Sun H-B, Kawata S, Two-photon photopolymerization and 3D lithographic microfabrication. Advances in Polymer Science 2004; 170:169-274.

[2] Tanaka T, Sun H-B, Kawata S, Rapid sub-diffraction-limit laser micro/nano-processing in a threshold material system. Applied Physics Letters 2002; 80(2): 312-314.

[3] Meza L R, Das S, Greer J R, Strong, lightweight, and recoverable three-dimensional ceramic nanolattices. Science 2014; 345(6202): 1322-1326.

[4] Juodkazis S, Mizeikis V, Seet K K, Misawa H, Wegst U G K, Mechanical properties and tuning of three-dimensional polymeric photonic crystals. Applied Physics Letters 2007; 91(24): 241904.

[5] Gissibl T, Thiele S, Herkommer A, Giessen H, Two-photon direct laser writing of ultracompact multi-lens objectives. Nature Photonics 2016; 10(8): 554.

[6] Huang T Y, Sakar M S, Mao A, Petruska A J, Qiu F, Chen X B, Kennedy S, Mooney D, Nelson B J, 3D printed microtransporters: Compound micromachines for spatiotemporally controlled delivery of therapeutic agents. Advanced Materials 2015; 27(42): 6644-6650.

[7] Selimis A, Mironov V, Farsari M, Direct laser writing: Principles and materials for scaffold 3D printing. Microelectronic Engineering 2015; 132: 83-89.

[8] Xia X, Afshar A, Yang H, Portela C M, Kochmann D M, Di Leo C V, Greer J R, Electrochemically reconfigurable architected materials. Nature 2019; 573(7773): 205-213.

[9] Saha S K, Uphaus T M, Cuadra J A, Divin C, Ladner I S, Enstrom K G, Panas R M, Kinematic fixtures to enable multi-material printing and rapid non-destructive inspection during two-photon lithography. Precision Engineering 2018; 54: 131-137.

[10] Oakdale J S, Smith R F, Forien J B, Smith W L, Ali S J, Bayu Aji L B, Willey T M, Ye J, van Buuren A W, Worthington M A, Direct laser writing of low-density interdigitated foams for plasma drive shaping. Advanced Functional Materials 2017; 27(43): 1702425.

[11] Hahn V, Kiefer P, Frenzel T, Qu J, Blasco E, Barner-Kowollik C, Wegener M, Rapid Assembly of Small Materials Building Blocks (Voxels) into Large Functional 3D Metamaterials. Advanced Functional Materials 2020: 1907795.

[12] Yang L, El-Tamer A, Hinze U, Li J, Hu Y, Huang W, Chu J, Chichkov B N, Parallel direct laser writing of micro-optical and photonic structures using spatial light modulator. Optics and Lasers in Engineering 2015; 70: 26-32.

[13] Mills B, Grant-Jacob J A, Feinaeugle M, Eason R W, Single-pulse multiphoton polymerization of complex structures using a digital multimirror device. Optics Express 2013; 21(12): 14853-14858.

[14] Saha S K, Wang D, Nguyen V H, Chang Y, Oakdale J S, Chen S-C, Scalable submicrometer additive manufacturing, Science 2019; 366: 105-109.

[15] Lu W-E, Dong X-Z, Chen W-Q, Zhao Z-S, Duan X-M, Novel photoinitiator with a radical quenching moiety for confining radical diffusion in two-photon induced photopolymerization. Journal of Materials Chemistry 2011; 21(15): 5650-5659.

[16] Saha S K, Oakdale J S, Cuadra J A, Divin C, Ye J, Forien J-B, Bayu Aji L B, Biener J, Smith W L, Radiopaque resists for two-photon lithography to enable submicron 3D imaging of polymer parts via X-ray computed tomography. ACS Applied Materials & Interfaces 2017; 10(1): 1164-1172.

[17] Zandrini T, Liaros N, Jiang U, Lu Y F, Fourkas J T, Osellame R, Baldacchini T, Effect of the resin viscosity on the writing properties of two-photon polymerization. Optical Materials Express 2019; 9(6): 2601-2616.

[18] Saha S K, Nguyen V, Wang D, Oakdale J S, Chen S-C, Parallel two-photon lithography for 3D printing of millimeter scale parts with submicron features, SPIE Photonics West Conference and Exposition 2018; presentation #10544-23.

[19] Serbin J, Egbert A, Ostendorf A, Chichkov B N, Houbertz R, Domann G, Schulz J, Cronauer C, Fröhlich L, Popall M, Femtosecond laser-induced two-photon polymerization of inorganic-organic hybrid materials for applications in photonics. Optics Letters 2003; 28(5): 301-303.

[20] Mueller J B, Fischer J, Mayer F, Kadic M, Wegener M, Polymerization kinetics in three-dimensional direct laser writing. Advanced Materials 2014; 26: 6566-6571.

[21] Bass M, Handbook of Optics. McGraw-Hill Professional, New York, 1994.

What is claimed is:

1. A method for performing an additive manufacturing operation to form a structure by processing a photopolymer resist material, the method comprising:

generating a first temporally focused light sheet onto or within a first region of a photopolymer resist material for a first finite duration of time to cause a first simultaneous polymerization of a first set of selected portions of the photopolymer resist material corresponding to a first selected pattern; and generating a second temporally focused light sheet onto or within a second region of a photopolymer resist material for a second finite duration of time to cause a second simultaneous polymerization of a second set of selected portions of the photopolymer resist material corresponding to a second selected pattern, wherein the first temporally focused light sheet and the second temporally focused light sheet collectively illuminate a continuous region on or in the photopolymer resist material in a depth direction of the photopolymer resist material that includes the first region and the second region, and wherein each of the first temporally focused light sheet and the second temporally focused light sheet is generated by directing a respective laser beam to a tunable mask and actuating a plurality of optically dispersive elements of the tunable mask to split the respective laser beam into distinct beam components to be collimated and focused to the first region and the second region, respectively.

2. The method of claim 1, wherein the photopolymer resist material illuminated by the first temporally focused light sheet and the second temporally focused light sheet has suppressed occurrences of over-polymerization.

3. The method of claim 1, wherein the photopolymer resist material illuminated by the first temporally focused light sheet and the second temporally focused light sheet, when processed, provides a top surface for a 3D structure that is observable to be flat and uniform.

4. The method of claim 1, further comprising:

simulating the generating first temporally focused light sheet and the generated second temporally focused light sheet.

5. The method of claim 1, wherein the photopolymer resist material illuminated by the first temporally focused light sheet and the second temporally focused light sheet can produce a submicron structural feature having an aspect ratio between about 1.2 and 2.0.

6. The method of claim 1, further comprising:

receiving, by a processor, a first image having a plurality of pixels corresponding to the first selected pattern;

directing, by the processor, the generation of the laser beam; and directing, by the processor, based on the first image, the tunable mask to generate the first temporally focused light sheet according to the first selected pattern.

7. The method of claim 1, further comprising:

receiving, by a processor, a second image having a plurality of pixels corresponding to the second selected pattern;

directing, by the processor, the generation of the laser beam; and directing, by the processor, based on the second image, the tunable mask to generate the second temporally focused light sheet according to the second selected pattern.

8. The method of claim 1, wherein the first finite duration of time is the same as the second finite duration of time.

9. The method of claim 1, wherein the first finite duration of time is different from the second finite duration of time.

10. The method of claim 1, wherein the first temporally focused light sheet has an associated first intensity level, wherein the second temporally focused light sheet has an associated second intensity level, and wherein the first intensity level is same as the second intensity level.

11. The method of claim 1, wherein the first temporally focused light sheet has an associated first intensity level, wherein the second temporally focused light sheet has an associated second intensity level, and wherein the first intensity level is different from the second intensity level.

12. The method of claim 1, wherein the second temporally focused light sheet is applied immediately after the first temporally focused light sheet or before a sufficient time has passed for localized effects of polymerization mechanisms of the photopolymer resist material to be minimized.

13. A laser-based manufacturing system for fabricating non-planar three-dimensional layers, the system comprising:

a laser for producing a laser beam with a plurality of optical wavelengths;

a tunable mask comprising a plurality of optically dispersive elements, each optically dispersive element being configured to receive the laser beam and split the beam into a plurality of distinct beam components, wherein each said beam component has spatially separated optical spectral components;

an optical assembly configured to collimate the distinct beam components to create a collimated beam and to focus the collimated beam into a focused laser beam, which is projected at an image plane onto or within a photopolymer resist material; and a controller operatively coupled to the tunable mask, the controller being configured by instructions to:

direct the tunable mask to actuate a first set of plurality of optically dispersive elements to direct the tunable mask to receive a laser beam and split the beam into distinct beam components to be collimated and focused by the optical assembly to generate a first temporally focused light sheet onto or within a first region of the photopolymer resist material, wherein the first temporally focused light sheet is generated onto or within the first region for a first finite duration of time to cause a first simultaneous polymerization of a first set of selected portions of the photopolymer resist material corresponding to a first selected pattern; and direct the tunable mask to actuate a second set of plurality of optically dispersive elements to direct the tunable mask to receive the laser beam and split the beam into distinct beam components to be collimated and focused by the optical assembly to generate a second temporally focused light sheet onto or within a first region of a photopolymer resist material, wherein the second temporally focused light sheet is generated onto or within the first region for a second finite duration of time to cause a second simultaneous polymerization of a first set of selected portions of the photopolymer resist material corresponding to a first selected pattern, wherein the first temporally focused light sheet and the second temporally focused light sheet collectively illuminate a continuous region on or in the photopolymer resist material in a depth direction of the photopolymer resist material that includes the first region and the second region.

14. The laser-based manufacturing system of claim 13, further comprising:

a support stage having a surface to support the photopolymer resist material; and one or more actuators configured to move a focusing element relative to the stage to write out a layer of the photopolymer resist material.

15. The laser-based manufacturing system of claim 13, wherein the tunable mask comprises micromirrors.

16. A non-transitory computer readable medium having instructions stored thereon, wherein execution of the instructions by a processor causes the processor to:

receive a first image having a plurality of pixels corresponding to a first pattern to project on and into a photopolymer resist material in an additive manufacturing operation to form a first layer of a structure;

receive a second image having a plurality of pixels corresponding to a second pattern to project on and into the photopolymer resist material in the additive manufacturing operation to form the first layer of the structure;

direct, based on the first image, a tunable mask to generate a first temporally focused light sheet according to the first pattern; and direct, based on the second image, the tunable mask to generate a second temporally focused light sheet according to the second pattern, wherein the first temporally focused light sheet is generated onto or within a first region of the photopolymer resist material for a first finite duration of time to cause a first simultaneous polymerization of a first set of selected portions of the photopolymer resist material corresponding to the first pattern, wherein the second temporally focused light sheet is generated onto or within a second region of a photopolymer resist material for a second finite duration of time to cause a second simultaneous polymerization of a second set of selected portions of the photopolymer resist material corresponding to the second pattern, wherein the first temporally focused light sheet and the second temporally focused light sheet are collectively illuminated on or into a continuous region in the photopolymer resist material in a depth direction of the photopolymer resist material that includes the first region and the second region, and wherein each of the first temporally focused light sheet and the second temporally focused light sheet is generated by directing a respective laser beam to a tunable mask and actuating a plurality of optically dispersive elements of the tunable mask to split the respective laser beam into distinct beam components to be collimated and focused to the first region and the second region, respectively.

17. The non-transitory computer readable medium of claim 16, wherein the execution of the instructions by the processor further causes the processor to:

receive a third image having a plurality of pixels corresponding to a third pattern to project on and into a second photopolymer resist material in the additive manufacturing operation to form a second layer of the structure;

receive a fourth image having a plurality of pixels corresponding to a fourth pattern to project on and into the second photopolymer resist material in the additive manufacturing operation to form the second layer of the structure;

direct, based on the third image, the tunable mask to generate a third temporally focused light sheet according the third pattern; and direct, based on the second image, the tunable mask to generate a fourth temporally focused light sheet according the fourth pattern, wherein the third temporally focused light sheet is generated onto or within a third region of the second photopolymer resist material for a third finite duration of time to cause a third simultaneous polymerization of a third set of selected portions of the second photopolymer resist material corresponding to the third pattern, wherein the fourth temporally focused light sheet is generated onto or within a fourth region of a photopolymer resist material for a second finite duration of time to cause a fourth simultaneous polymerization of a fourth set of selected portions of the second photopolymer resist material corresponding to the fourth pattern, and wherein the third temporally focused light sheet and the fourth temporally focused light sheet are collectively illuminated on or into a continuous region in the second photopolymer resist material that includes the third region and the fourth region.

18. The non-transitory computer readable medium of claim 16, wherein the photopolymer resist material illuminated by the first temporally focused light sheet and the second temporally focused light sheet has suppressed occurrences of over-polymerization to provide a top surface for the first layer of the structures that is observable to be flat and uniform.

* * * * *